(12) United States Patent
Kim et al.

(10) Patent No.: US 11,600,545 B2
(45) Date of Patent: *Mar. 7, 2023

(54) SEMICONDUCTOR DEVICES INCLUDING A LOWER SEMICONDUCTOR PACKAGE, AN UPPER SEMICONDUCTOR PACKAGE ON THE LOWER SEMICONDUCTOR PACKAGE, AND A CONNECTION PATTERN BETWEEN THE LOWER SEMICONDUCTOR PACKAGE AND THE UPPER SEMICONDUCTOR PACKAGE

(71) Applicant: Samsung Electronics Co., Ltd., Suwon-si (KR)

(72) Inventors: Ji Hwang Kim, Cheonan-si (KR); Jong Bo Shim, Anyang-si (KR); Jang Woo Lee, Seoul (KR); Yung Cheol Kong, Cheonan-si (KR); Young Hoon Hyun, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 14 days.

This patent is subject to a terminal disclaimer.

(21) Appl. No.: 17/376,570

(22) Filed: Jul. 15, 2021

(65) Prior Publication Data
US 2021/0343617 A1 Nov. 4, 2021

Related U.S. Application Data

(63) Continuation of application No. 16/582,418, filed on Sep. 25, 2019, now Pat. No. 11,069,592.

(30) Foreign Application Priority Data

Dec. 14, 2018 (KR) .................. 10-2018-0161564

(51) Int. Cl.
H01L 23/367 (2006.01)
H01L 23/31 (2006.01)
H01L 23/00 (2006.01)

(52) U.S. Cl.
CPC ........ *H01L 23/367* (2013.01); *H01L 23/3157* (2013.01); *H01L 24/08* (2013.01); *H01L 24/48* (2013.01); *H01L 2224/02371* (2013.01)

(58) Field of Classification Search
CPC .............. H01L 23/367; H01L 23/3157; H01L 24/08; H01L 24/48
(Continued)

(56) References Cited

U.S. PATENT DOCUMENTS 4,033,134 A 7/1977 Bentley
4,235,952 A 11/1980 Holmes et al.
(Continued)

FOREIGN PATENT DOCUMENTS

EP 3389089 A1 10/2018

OTHER PUBLICATIONS

European Communication pursuant to Article 94(3) EPC dated Mar. 16, 2022 for corresponding European Application No. 19215947.3.
(Continued)

*Primary Examiner* — Quoc D Hoang
(74) *Attorney, Agent, or Firm* — Harness, Dickey & Pierce, P.L.C.

(57) ABSTRACT

A semiconductor includes a lower structure, an upper structure on the lower structure, and a connection pattern between the lower structure and the upper structure. The connection pattern is configured to electrically connect the lower structure and the upper structure to each other. The lower structure includes a lower base and a first lower chip on the lower base. The first lower chip includes a chip bonding pad, a pad structure, and a heat sink structure. The connection
(Continued)

pattern is connected to the upper structure and extends away from the upper structure to be connected to the pad structure. The pad structure has a thickness greater than a thickness of the chip bonding pad. At least a portion of the heat sink structure is at a same height level as at least a portion of the pad structure.

19 Claims, 33 Drawing Sheets

(58) Field of Classification Search
USPC .......................................................... 257/712
See application file for complete search history.

(56) References Cited

U.S. PATENT DOCUMENTS

| | | | |
|---|---|---|---|
| 4,500,774 | A | 2/1985 | Honjo |
| 4,646,203 | A | 2/1987 | Ngo et al. |
| 4,699,589 | A | 10/1987 | Friedman et al. |
| 5,003,441 | A | 3/1991 | Crowe et al. |
| 5,729,432 | A | 3/1998 | Shim et al. |
| 6,304,445 | B1 | 10/2001 | Bollesen |
| 6,311,687 | B1 | 11/2001 | Aidelsburger |
| 7,619,305 | B2 | 11/2009 | Fan et al. |
| 8,471,376 | B1 | 6/2013 | Liou et al. |
| 9,230,876 | B2 | 1/2016 | Lee et al. |
| 9,392,698 | B2 | 7/2016 | Hong et al. |
| 9,673,175 | B1 | 6/2017 | Bharatham |
| 9,685,426 | B2 | 6/2017 | Yu et al. |
| 9,781,863 | B1 | 10/2017 | Kim |
| 11,069,592 | B2 * | 7/2021 | Kim ................ H01L 23/4334 |
| 2003/0127734 | A1 | 7/2003 | Lee et al. |
| 2004/0251531 | A1 | 12/2004 | Yang et al. |
| 2005/0133932 | A1 | 6/2005 | Pohl et al. |
| 2006/0056156 | A1 | 3/2006 | Long et al. |
| 2008/0244970 | A1 | 10/2008 | Ide et al. |
| 2008/0258293 | A1 | 10/2008 | Yang et al. |
| 2009/0084106 | A1 | 4/2009 | Sandler |
| 2010/0219134 | A1 | 9/2010 | Bowen |
| 2010/0283140 | A1 | 11/2010 | Kim et al. |
| 2010/0296946 | A1 | 11/2010 | Chen et al. |
| 2011/0022041 | A1 | 1/2011 | Ingle et al. |
| 2011/0024888 | A1 | 2/2011 | Pagaila et al. |
| 2011/0068481 | A1 | 3/2011 | Park et al. |
| 2011/0133324 | A1 | 6/2011 | Fan et al. |
| 2012/0045871 | A1 | 2/2012 | Lee et al. |
| 2012/0292785 | A1 | 11/2012 | Pagaila et al. |
| 2012/0317332 | A1 | 12/2012 | Kwak et al. |
| 2013/0147026 | A1 | 6/2013 | Topacio et al. |
| 2013/0256872 | A1 | 10/2013 | Su et al. |
| 2014/0097533 | A1 | 4/2014 | Liu et al. |
| 2014/0327129 | A1 | 11/2014 | Cho et al. |
| 2016/0079208 | A1 | 3/2016 | Heo et al. |
| 2017/0071074 | A1 | 3/2017 | Matheson et al. |
| 2017/0154878 | A1 | 6/2017 | Kim et al. |
| 2017/0162545 | A1 | 6/2017 | Park et al. |
| 2017/0243813 | A1 | 8/2017 | Wu et al. |
| 2018/0005991 | A1 | 1/2018 | Seidemann et al. |
| 2018/0240729 | A1 | 8/2018 | Kim et al. |
| 2018/0294239 | A1 | 10/2018 | Sakata et al. |

OTHER PUBLICATIONS

Extended European Search Report dated Apr. 24, 2020 for corresponding European Application No. 19215947.3.

* cited by examiner

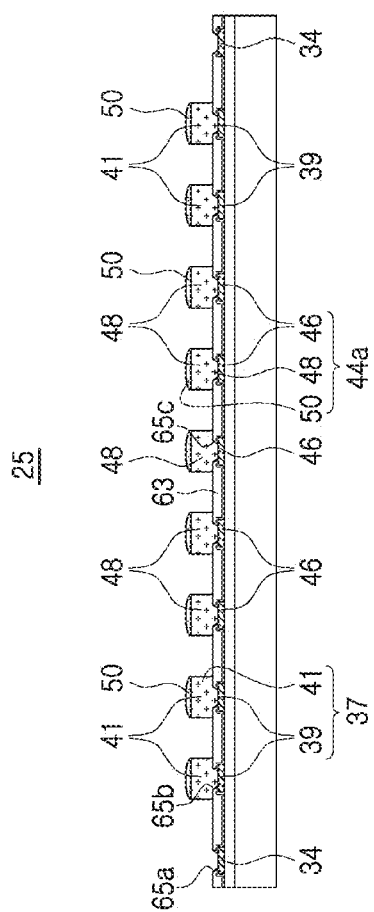

SEMICONDUCTOR DEVICES INCLUDING A LOWER SEMICONDUCTOR PACKAGE, AN UPPER SEMICONDUCTOR PACKAGE ON THE LOWER SEMICONDUCTOR PACKAGE, AND A CONNECTION PATTERN BETWEEN THE LOWER SEMICONDUCTOR PACKAGE AND THE UPPER SEMICONDUCTOR PACKAGE

CROSS-REFERENCE TO RELATED APPLICATIONS

This application is a continuation of U.S. application Ser. No. 16/582,418, filed Sep. 25, 2019, which claims benefit of priority to Korean Patent Application No. 10-2018-0161564 filed on Dec. 14, 2018 in the Korean Intellectual Property Office, the disclosure of each of which is incorporated herein by reference in its entirety.

BACKGROUND

1. Field

Example embodiments of the inventive concepts relate to semiconductor packages, and more particularly, to semiconductor packages including one or more heat sink structures.

2. Description of Related Art

As demand for high capacity, thinning, and miniaturization of electronic products, including electronic devices, has increased, various types of semiconductor packages have been developed. Package technologies for incorporating a plurality of chips in a single package, among such various types of semiconductor packages, has been developed. In some cases, heat generated inside a semiconductor package incorporating a plurality of chips may be difficult to release to the outside of the semiconductor package. As a result, such heat generation may cause package performance or the like to be degraded.

SUMMARY

An aspect of the inventive concepts is to provide a semiconductor package having improved heat sink characteristics.

According to some example embodiments, a semiconductor package may include a lower structure, an upper structure on the lower structure, and a connection pattern between the lower structure and the upper structure. The lower structure may include a lower base and a first lower chip on the lower base. The first lower chip may include a chip bonding pad, a pad structure, and a heat sink structure. The pad structure may have a thickness greater than a thickness of the chip bonding pad. At least a portion of the heat sink structure may be at a same height level as at least a portion of the pad structure. The connection pattern may be configured to electrically connect the lower structure and the upper structure to each other. The connection pattern may be connected to the upper structure. The connection pattern may extend away from the upper structure to be connected to the pad structure.

According to some example embodiments, a semiconductor package may include a lower structure, an upper structure on the lower structure, and a connection pattern between the lower structure and the upper structure. The lower structure may include a lower base, a lower chip on the lower base, and a lower mold layer on the lower base such that the lower mold layer covers the lower chip. The lower chip may include a pad structure and a heat sink structure. At least a portion of the heat sink structure may be at a same height level as at least a portion of the pad structure. The lower mold layer may have a top surface that is at a higher height level than both a top surface of the pad structure and a top surface of the heat sink structure. The lower mold layer may have a first opening that extends through at least a portion of the lower mold layer to expose at least a portion of the top surface of the pad structure. The connection pattern may be configured to electrically connect the lower structure and the upper structure to each other. The connection pattern may be connected to the upper structure. The connection pattern may extend away from the upper structure to be connected to the portion of the top surface of the pad structure exposed by the first opening.

According to some example embodiments, a semiconductor package may include a lower structure, an upper structure on the lower structure, and a connection pattern between the lower structure and the upper structure. The lower structure may include a lower base, a first lower chip on the lower base, a second lower chip between the first lower chip and the lower base, and a lower mold layer covering the first lower chip. The first lower chip may include a substrate, a chip bonding pad on the substrate, a pad structure, and a heat sink structure. At least a portion of the heat sink structure may be at a same height level as at least a portion of the pad structure. The lower mold layer may have a top surface that is at a higher height level than both a top surface of the pad structure and a top surface of the heat sink structure. The lower mold layer may have a first opening that extends through at least a portion of the lower mold layer to expose at least a portion of the top surface of the pad structure. The upper structure may be isolated from direct contact with the lower structure. The connection pattern may be configured to electrically connect the lower structure and the upper structure to each other. The connection pattern may be configured to connect the portion of the top surface of the pad structure and the upper structure to each other.

BRIEF DESCRIPTION OF DRAWINGS

The above and other aspects, features, and advantages of the present disclosure will be more clearly understood from the following detailed description, taken in conjunction with the accompanying drawings, in which:

FIGS. 26A, 26B, 26C, 27A, and 27B are cross-sectional views illustrating an example of a method of fabricating a semiconductor package according to some example embodiments of the inventive concepts.

DETAILED DESCRIPTION

Figure 1:
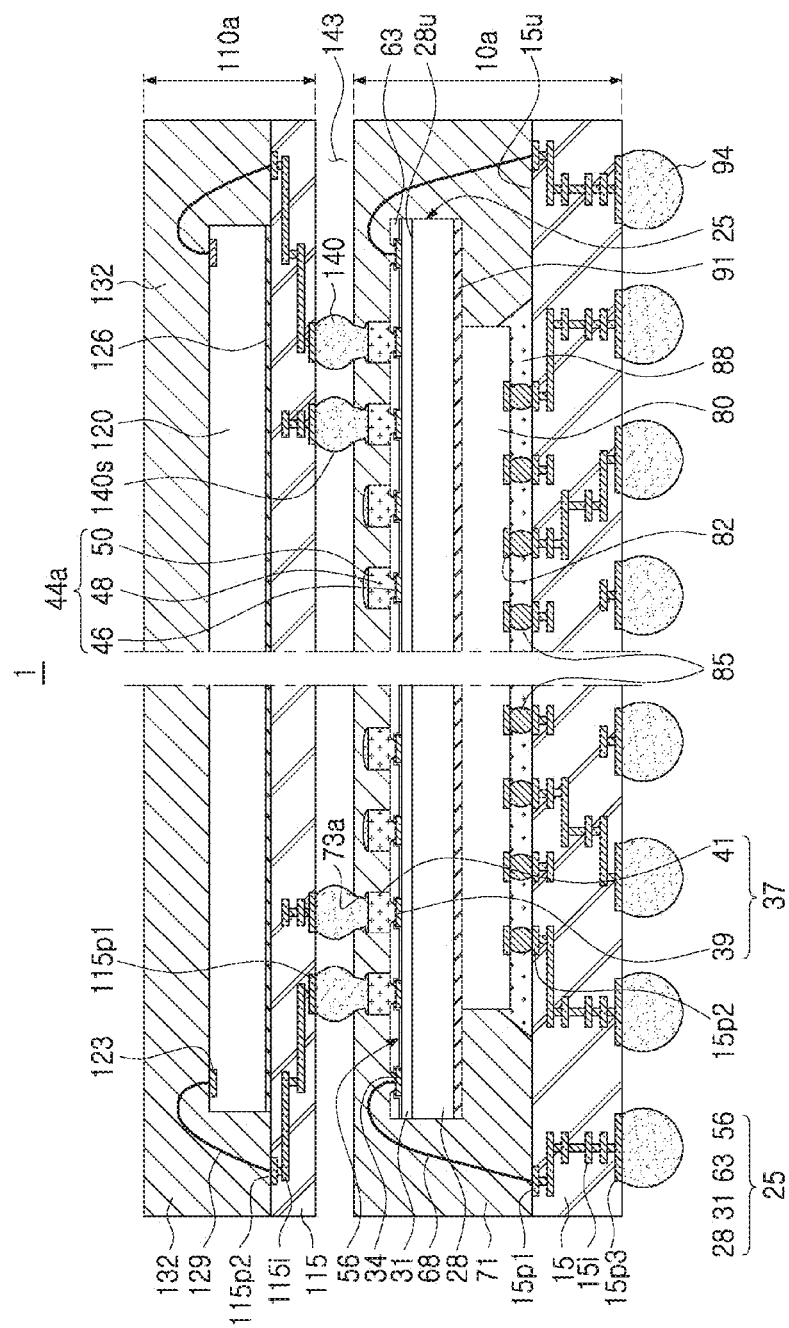
FIG. 1 is a cross-sectional view illustrating an example of a semiconductor package according to some example embodiments of the inventive concepts.
Figure 2:
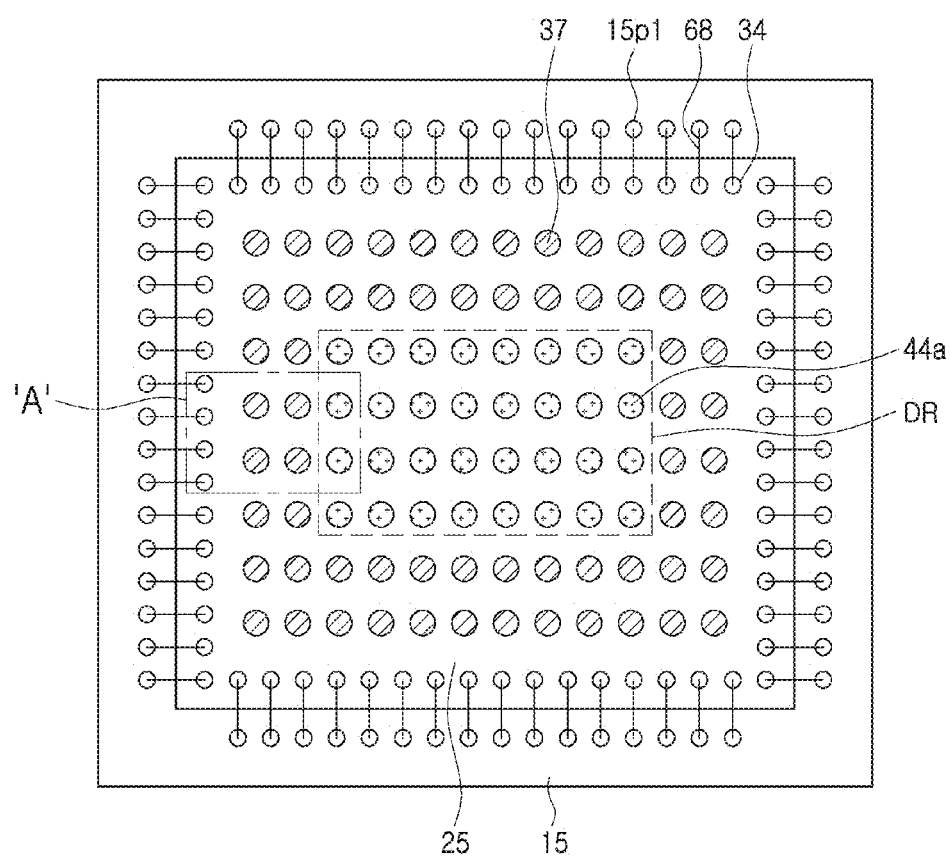
FIG. 2 is a plan view illustrating an example of some components of a semiconductor package according to some example embodiments of the inventive concepts.
Figure 3:
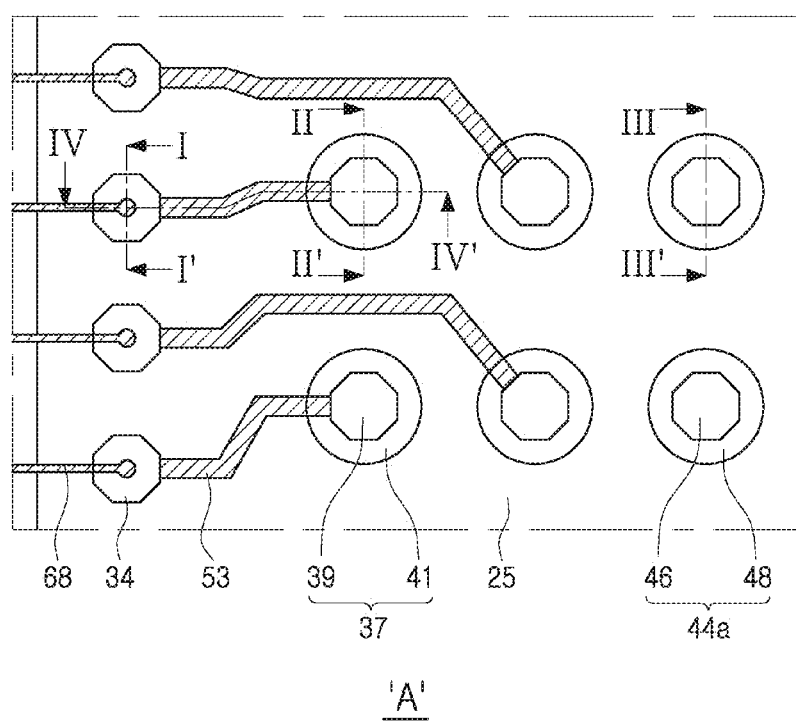
FIG. 3 is an enlarged view illustrating an example of some components disposed in an enlarged area of portion 'A' in FIG. 2.
Figure 4A:
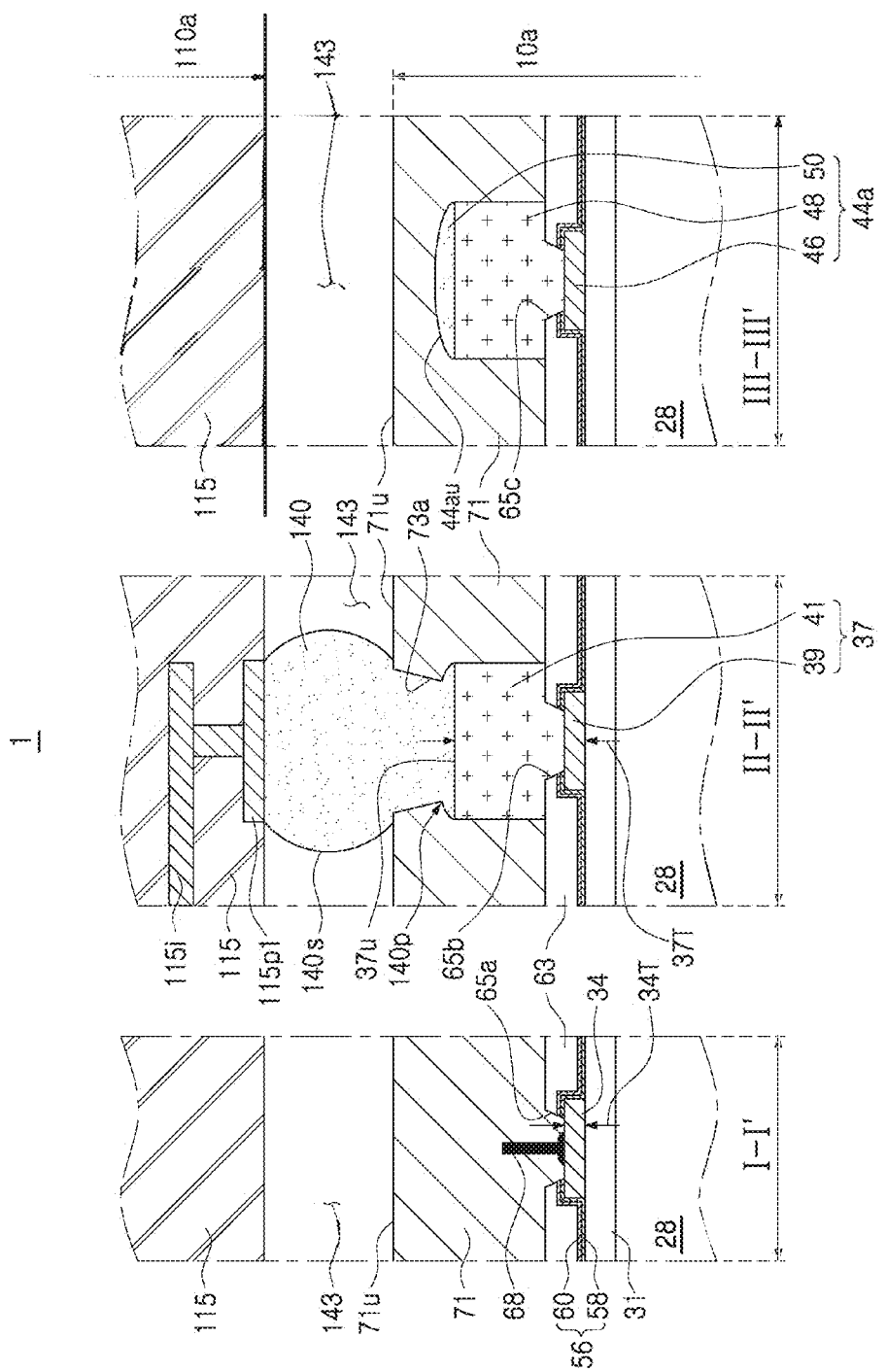
FIG. 4A is a partially enlarged cross-sectional view of a region taken along lines I-I', II-II', and III-III' in FIG. 3.
Figure 4B:
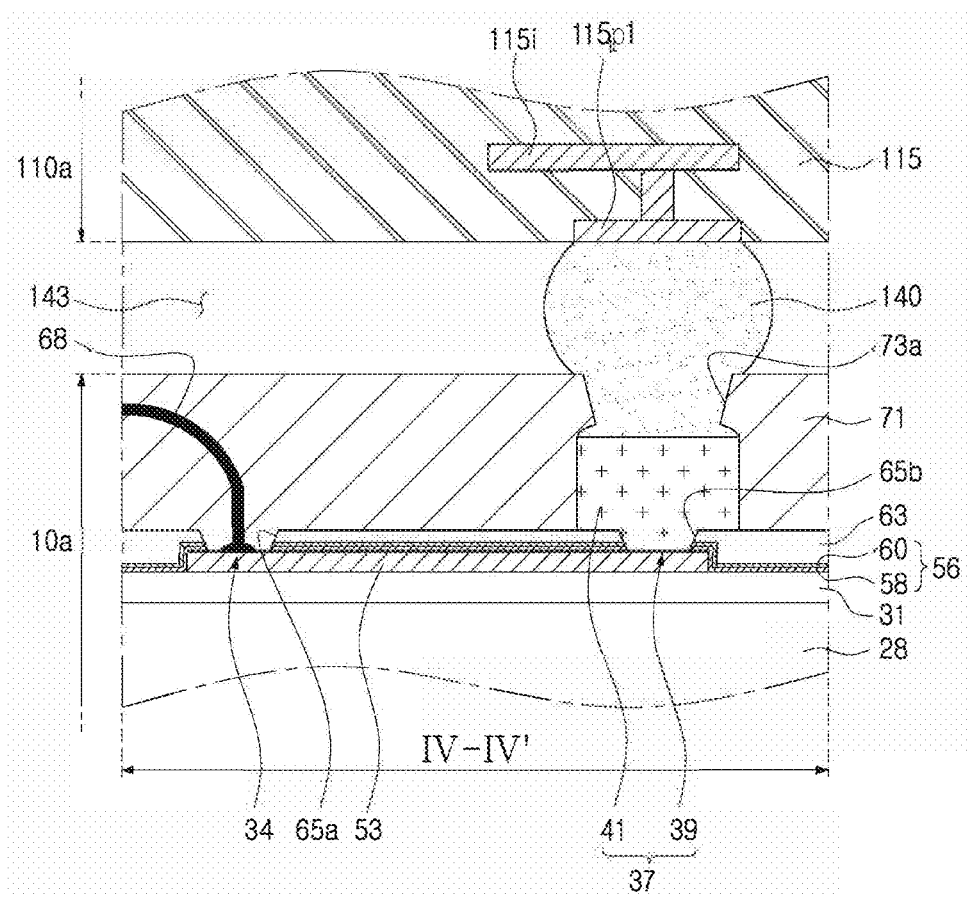
FIG. 4B is a partially enlarged cross-sectional view of a region taken along line IV-IV' in FIG. 3.

Hereinafter, an example of a semiconductor package according to some example embodiments of the inventive concepts will be described with reference to FIGS. 1, 2, 3, and 4. FIG. 1 is a cross-sectional view illustrating an example of a semiconductor package according to some example embodiments of the inventive concepts, FIG. 2 is a plan view illustrating an example of some components of a semiconductor package according to some example embodiments of the inventive concepts, FIG. 3 is an enlarged view illustrating an example of some components disposed in an enlarged area of portion 'A' in FIG. 2, FIG. 4A is a partially enlarged cross-sectional view of a region taken along lines I-I', II-II', and III-III' in FIG. 3, and FIG. 4B is a partially enlarged cross-sectional view of a region taken along line IV-IV' in FIG. 3.

Referring to FIGS. 1 to 4, a semiconductor package 1 may include a lower structure 10a, an upper structure 110a on (e.g., above) the lower structure 10a, and a connection pattern 140 between the lower structure 10a and the upper structure 110a.

It will be understood that an element that is "on" another element may be above or below the other element. Additionally, an element that is "on" another element may be in direct contact with the other element or may be isolated from direct contact with the other element by one or more interposing spaces and/or structures.

It will further be understood that an element that is described herein to be connected to another element may directly contact the other element may be directly connected to the other element. An element that described herein to be connected to another element may be electrically connected and/or physically connected to the other element. An element that is described herein to be electrically connected to another element may be directly, physically connected to the other element. An element that is described herein to be physically connected to another element may be electrically connected to the other element. An element that is described herein to electrically connect two or more elements together may physically connect the two or more elements together. An element that is described herein to physically connect two or more elements together may electrically connect the two or more elements together. An element that is described herein to connect two or more elements together may electrically and/or physically connect the two or more elements together.

As shown in at least FIG. 1, the lower structure 10a may include a lower base 15 and a first lower chip 25 on (e.g., above) the lower base 15.

The first lower chip 25 may include a chip bonding pad 34, a pad structure 37, and a heat sink structure 44a. The pad structure 37 may include a first pad 39 and a second pad 41 on the first pad 39. The pad structure 37 may have a thickness 37T greater than a thickness 34T of the chip bonding pad 34. The second pad 41 may have a thickness greater than a thickness of the first pad 39. The chip bonding pad 34 may be disposed on the same level ("same height level") as the first pad 39 and may include the same material as the first pad 39. The first lower chip 25 may further include a redistribution line 53 on the substrate 28, where the redistribution line 53 is configured to electrically connect the chip bonding pad 34 and the pad structure 37 to each other. As shown in at least FIG. 3, the redistribution line 53 may be configured to electrically connect the first pad 39 and the chip bonding pad 34 to each other.

At least a portion of the heat sink structure 44a may be disposed on the same level as at least a portion of the pad structure 37.

In some example embodiments, the term "level" may refer to a height level from a certain reference, for example, a top surface 15u of the lower base 15 or a top surface 28u of a substrate 28. Accordingly, hereinafter, the term "level" will be understood as a height level from a certain reference even though it is not described otherwise.

The heat sink structure 44a may include a heat sink pattern. The heat sink pattern of the heat sink structure 44a may include the same material as the first pad 39, the second pad 41, or both the first and second pads 39 and 41 of the pad structure 37. For example, the heat sink structure 44a may include a first heat sink pattern 46 and a second heat sink pattern 48 on the first heat sink pattern 46. At least a portion of the heat sink structure 44a may be at a same height level as at least a portion of the pad structure 37. The heat sink structure 44a may include a heat sink pattern that is at a same height level as the first pad 39, the second pad 41, or both the first pad 39 and the second pad 41. For example, as shown in at least FIG. 1, the first heat sink pattern 46 may be disposed at the same level as the first pad 39. The first heat sink pattern 46 may include the same material as the first pad 39. For example, the first heat sink pattern 46 and the first pad 39 may at least partially comprise aluminum or a conductive material which may replace aluminum. The second heat sink pattern 48, which may be at least a portion of a single heat sink pattern that includes the first and second heat sink patterns 46 and 48, may be disposed at the same level as at least a portion of the second pad 41. The second heat sink pattern 48 may include the same material as the second pad 41. In some example embodiments, the first and second heat sink patterns 46 and 48 may be collectively referred to as a single heat sink pattern. The second heat sink pattern 48 and the second pad 41 may at least partially comprise a material different from the material of the first heat sink pattern 46 and the first pad 39. For example, the second heat sink pattern 48 and the second pad 41 may at least partially comprise copper or a conductive material which may replace copper.

The heat sink structure 44a may further include a capping pattern 50 on the first heat sink pattern 46 and the second heat sink pattern 48. The capping pattern 50 may at least partially comprise a material different from the materials of the first and second heat sink patterns 46 and 48. The connection pattern 140 may at least partially comprise the same material as the capping pattern 50. The connection pattern 140 and the capping pattern 50 may include a material different from a material of a heat sink pattern (e.g., the first and/or second heat sink patterns 46 and 48) and the second pad 41. The capping pattern 50 may have an upwardly convex shape or a rounded top surface that may at least partially comprise a top surface 44au of the heat sink structure 44a. For example, the capping pattern 50 may at least partially comprise a soldering material or a heat sink material which may replace the solder material. For example, the capping pattern 50 may at least partially comprise a tin-silver (SnAg) material. The heat sink structure 44a may include the first heat sink pattern 46, the second heat sink pattern 48, and the capping pattern 50.

In some example embodiments, the heat sink structure 44a may be disposed in a dummy region DR surrounded by the pad structure 37.

The first lower chip 25 may further include the substrate 28, a lower layer 31 on the substrate 28, an upper layer 63 on the lower layer 31, and an intermediate layer 56 between the lower layer 31 and the upper layer 63. As shown in at least FIG. 1, the chip bonding pad 34, the pad structure 37, and the heat sink structure 44a may be on the lower layer 31. In some example embodiments, the first lower chip 25 may include the substrate 28, the chip bonding pad 34 on the substrate 28, the pad structure 37, and the heat sink structure 44a.

The substrate 28 may be a semiconductor substrate. For example, the substrate 28 may be a silicon substrate. The lower layer 31 may include an insulating material (for example, a silicon oxide, or the like). The intermediate layer 56 may have a single layer structure or a multi-layer structure. For example, the intermediate layer 56 may include a first insulating layer 58 and a second insulating layer 60 on the first insulating layer 58. The first and second insulating layers 58 and 60 may at least partially comprise different materials to each other. For example, the first insulating layer 58 may include a silicon oxide, and the second insulating layer 60 may include a silicon nitride. The upper layer 63 may at least partially comprise an insulating material. For example, the upper layer 63 may at least partially comprise a polyimide material or an insulating material which may replace the polyimide material.

The chip bonding pad 34, the pad structure 37, the redistribution line 53, and the heat sink structure 44a may be disposed on the lower layer 31.

As shown in at least FIGS. 4A-4B, the upper layer 63 and the intermediate layer 56 may have a first opening 65a that extends through both the upper layer 63 and the intermediate layer 56 to expose at least a portion of the chip bonding pad 34 from the upper layer 63 and intermediate layer 56, and a second opening 65b that extends through both the upper layer 63 and the intermediate layer 56 to expose at least a portion of the pad structure 37 from the upper layer 63 and intermediate layer 56, for example exposing the first pad 39. The upper layer 63 and the intermediate layer 56 may further have a third opening 65c that extends through both the upper layer 63 and the intermediate layer 56 to expose at least a portion of the first heat sink pattern 46 from the upper layer 63 and intermediate layer 56.

In some example embodiments, the chip bonding pad 34, the redistribution line 53, and the first pad 39 may be formed as a single body. The chip bonding pad 34, the redistribution line 53, and the first pad 39 may be continuously connected without a boundary. The chip bonding pad 34, the redistribution line 53, and the first pad 39 may be integrally and continuously formed. Restated, the chip bonding pad 34, the redistribution line 53, and the first pad 39 may be included in a single, continuous instance of material ("component," "part," or the like).

The lower base 15 may be a printed circuit board (PCB). As shown in at least FIG. 1, the lower base 15 may include a first base pad 15p1, a second base pad 15p2, disposed on a top surface of the lower base 15, and a third base pad 15p3 disposed on a bottom surface of the lower base 15. The lower base 15 may include an internal wiring 15i disposed in the lower base 15.

As shown in at least FIG. 1, the lower structure 10a may further include a wire 68 configured to electrically connect the chip bonding pad 34 of the first lower chip 25 and the first base pad 15p1 of the lower base 15 to each other.

The lower structure 10a may further include a second lower chip 80 between the first lower chip 25 and the lower base 15. As shown in FIG. 1, the second lower chip 80 may be on the lower base 15. As shown in FIG. 1, the second lower chip 80 may be mounted on the lower base 15. The second lower chip 80 may include a pad 82 disposed on a surface disposed to oppose the lower base 15.

While terms such as "first" and "second," etc., may be used to describe various components, such components must not be understood as being limited to the above terms. The above terms are used only to distinguish one component from another. For example, a first component may be referred to as a second component without departing from the scope of rights of the present inventive concepts, and likewise a second component may be referred to as a first component. In some example embodiments, the terms "first" and "second," etc., may be replaced with "lower" and "upper," etc. Therefore, the terms "first lower chip" and "second lower chip" may be replaced with "second lower chip" and "first lower chip", respectively.

The lower structure 10a may further include a conductive bump 85 connecting the pad 82 of the second lower chip 80 and the second base pad 15p2 of the lower base 15 to each other. Accordingly, the second lower chip 80 may be mounted on the lower base 15 in a flip chip manner. The lower structure 10a may further include an underfill material 88 filling a gap between the second lower chip 80 and the lower base 15.

The lower structure 10a may further include an adhesive layer 91 disposed on a surface of the first lower chip 25 facing the lower base 15. The adhesive layer 91 may be disposed between the first lower chip 25 and the second lower chip 80 to bond the first lower chip 25 and the second lower chip 80 to each other.

The lower structure 10a may further include a lower mold layer 71. The lower mold layer 71 may be on the lower base 15 such that the lower mold layer 71 covers at least the first lower chip 25. The lower mold layer 71 may include a polymer resin such as an epoxy molding compound. The lower mold layer 71 may cover the first and second lower chips 25 and 80 mounted on the lower base 15. The lower mold layer 71 may cover an upper portion of the first lower chip 25 and may cover the wire 68. The lower mold layer 71 may have a first opening 73a extending through at least a portion of the lower mold layer 71 to expose at least a portion of a top surface 37u of the pad structure 37 from the lower mold layer 71, and thus exposing at least a portion of the pad structure 37 from the lower mold layer 71. As shown in at least FIG. 1 and FIG. 4A, the connection pattern 140 may extend away from the upper structure 110a (e.g., downwardly) to be directly physically connected to the portion of the pad structure 37, including the portion of the top surface 37u of the pad structure 37, that is exposed by the first opening 37a. The connection pattern 140 may be configured to connect the portion of the top surface 37u of the pad structure 37 that is exposed by the first opening 73a to the upper structure 110a.

In some example embodiments, the lower mold layer 71 may cover a top surface 44au of the heat sink structure 44a. As shown in at least FIG. 1 and FIG. 4A, the top surface 71u of the lower mold layer 71 may be at a higher height level than (e.g., may be distal from the lower base 15 in relation to) both a top surface 37u of the pad structure 37 and a top surface 44au of the heat sink structure 44a.

A solder ball 94 may be disposed on (e.g., below) the lower base 15 to be electrically connected to the third base pad 15p3 of the lower base 15.

The upper structure 110a may include an upper base 115 and an upper chip 120 on (e.g., above) the upper base 115. The upper base 115 includes a first upper pad 115p1, disposed on a surface disposed to oppose the lower structure 10a, a second upper pad 115p2, disposed on a surface disposed to oppose the upper chip 120, and an internal wiring 115i in the upper base 115.

The upper structure 110a may further include an adhesive layer 126 between the upper chip 120 and the upper base 115.

The upper chip 120 may include an upper bonding pad 123 disposed on a top surface thereof. The upper structure 110a further includes an upper wire 129 configured to electrically connect the upper bonding pad 123 of the upper chip 120 and the second upper pad 115p2 of the upper base 115 to each other. Accordingly, the upper chip 120 may be mounted on the upper base 115 by wire bonding. Example embodiments of the inventive concepts are not limited to a case in which the upper chip 120 is mounted on the upper base 115 by wire bonding. For example, the upper chip 120 may be mounted on the upper base 115 in a flip chip manner.

The connection pattern 140 may be configured to electrically connect the lower structure 10a and the upper structure 110a to each other. The connection pattern 140 may be configured to physically connect the lower structure 10a and the upper structure 110a to each other. The connection pattern 140 may be disposed between the lower structure 10a and the upper structure 110a. The connection pattern 140 may be in contact with (e.g., may be directly on, may be directly physically connected to, or the like) the pad structure 37 of the lower structure 10a and the first upper pad 115p1 of the upper structure 110a. The connection pattern 140 may be extended upwardly (e.g., away from the lower base 15), while being brought into contact with the pad structure 37, to be in contact with the first upper pad 115p1 of the upper structure 110a. The connection pattern 140 may at least partially comprise a soldering material. The connection pattern 140 may be referred to as a "solder bump".

In some example embodiments, the lower structure 10a and the upper structure 110a may be spaced apart from each other (e.g., may be isolated from direct contact with each other) and may be connected to each other by the connection pattern 140. As shown in at least FIG. 1, the connection pattern 140 may be connected to the upper structure 110a and may extend away from the upper structure 110a (e.g., downwardly) to be directly physically connected to the pad structure 37. As shown in at least FIG. 1 and FIG. 4A, an empty space 143 may be formed between the lower structure 10a and the upper structure 110a to expose at least a portion of a side surface 140s of the connection pattern 140.

In some example embodiments, the connection pattern 140 may be in contact with a top surface of the pad structure 37 while filling the first opening 73a of the lower mold layer 71 exposing at least a portion of the top surface of the pad structure 37. At least a portion of the first opening 73a of the lower mold layer 71 may have a width smaller than a width of the second pad 41 of the pad structure 37.

As shown in at least FIG. 4A, the first opening 73a of the lower mold layer 71 may include a portion narrowed and then widened in a direction pointing from a top surface of the lower mold layer 71 to the pad structure 37. Accordingly, in the first opening 73a of the lower mold layer 71, the connection pattern 140 may include an inflection portion 140p narrowed and then widened in a direction pointing from a portion, brought into contact with a top surface of the second pad 41 of the pad structure 37, to the upper structure 110a. Restated, and as shown in at least FIG. 4A, a portion of the connection pattern 140 that is in the first opening 73a may include an inflection portion 140p that narrows and then widens in proportion with distance from the top surface 37u of the pad structure 37.

Next, various modified examples of the semiconductor package 1 according to some example embodiments of the inventive concepts will be described with reference to FIGS. 5 to 25 individually or in combination.

Figure 23:
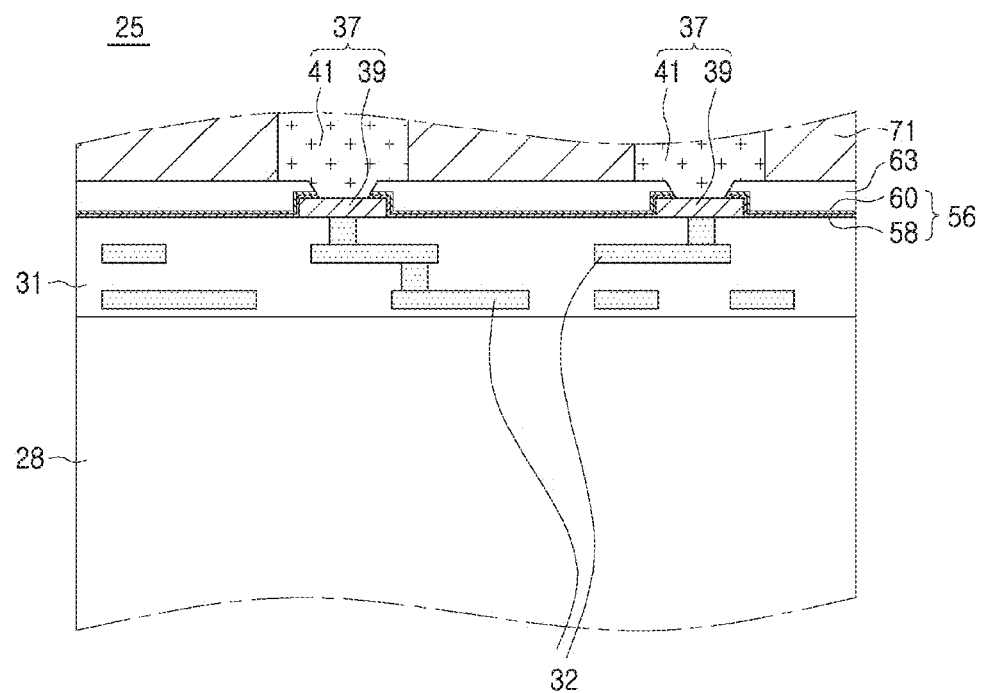
FIG. 23 is a partially enlarged cross-sectional view illustrating a modified example of a lower structure of a semiconductor package according to some example embodiments of the inventive concepts.
Figure 24:
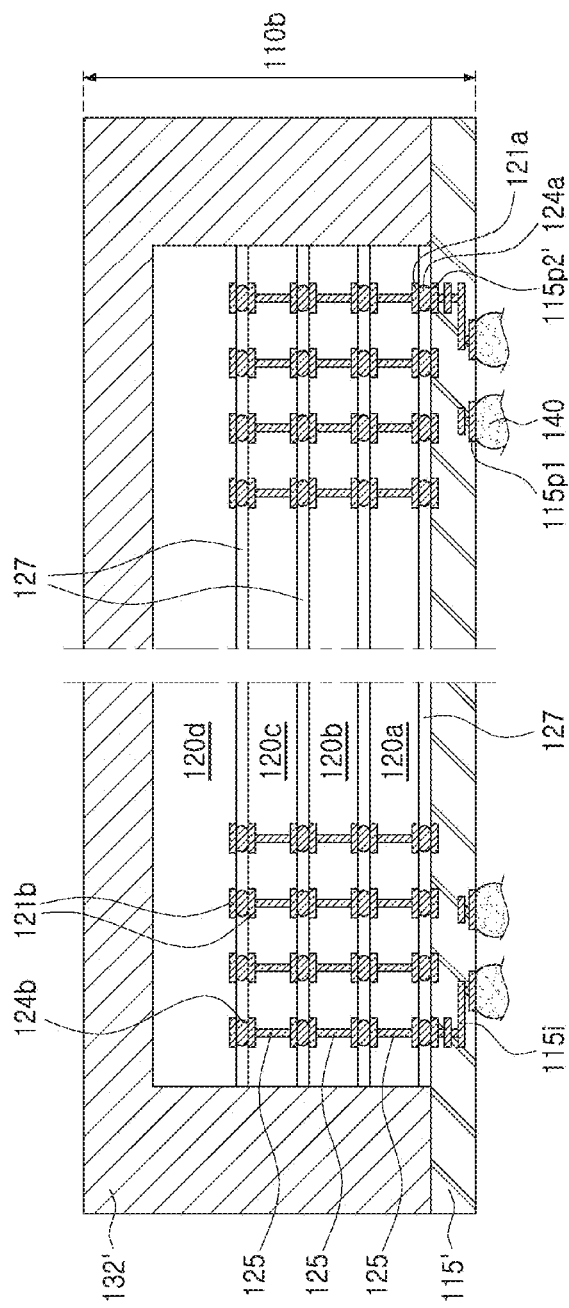
FIG. 24 is a partially enlarged cross-sectional view illustrating a modified example of an upper structure of a semiconductor package according to some example embodiments of the inventive concepts.
Figure 25:
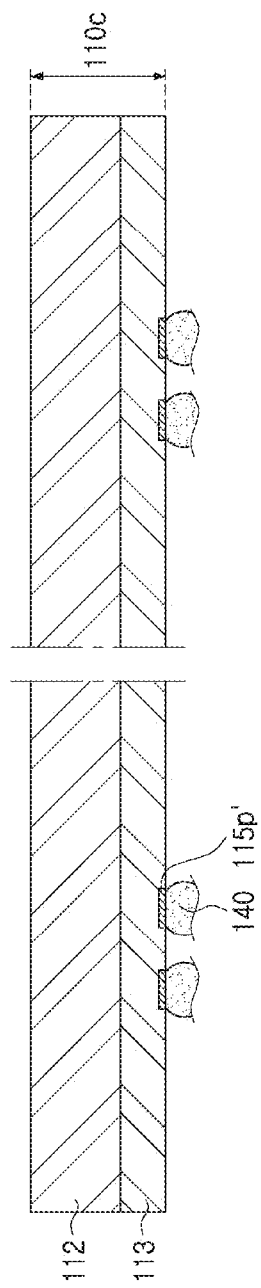
FIG. 25 is a partially enlarged cross-sectional view illustrating a modified example of an upper structure of a semiconductor package according to some example embodiments of the inventive concepts.

In FIGS. 5 to 25, each of FIG. 5, FIG. 6, FIG. 7, FIG. 8, FIG. 10, FIG. 11, FIG. 12, FIG. 13, FIG. 14, FIG. 16, FIG. 18, FIG. 19, and FIG. 20 are cross-sectional views illustrating a modified example of a semiconductor package according to some example embodiments of the inventive concepts, and each of FIGS. 24 and 25 is a cross-sectional view illustrating a modified example of an upper structure of a semiconductor package according to some example embodiments of the inventive concepts. In FIGS. 5 to 25, each of FIGS. 9 and 21 is a partially enlarged cross-sectional view of a region, taken along lines I-I', II-II', and III-III' in FIG. 3, illustrating a modified example of a semiconductor package according to some example embodiments of the inventive concepts, each of FIGS. 15, 17A, 17B, and 17C is a plan view illustrating a modified example of some components of a semiconductor package according to some example embodiments of the inventive concepts, FIG. 22 is a partially enlarged cross-sectional view of a region taken along line IV-IV' in FIG. 3, and FIG. 23 is a partially enlarged cross-sectional view illustrating a modified example of a lower structure of a semiconductor package according to some example embodiments of the inventive concepts.

Figure 5:
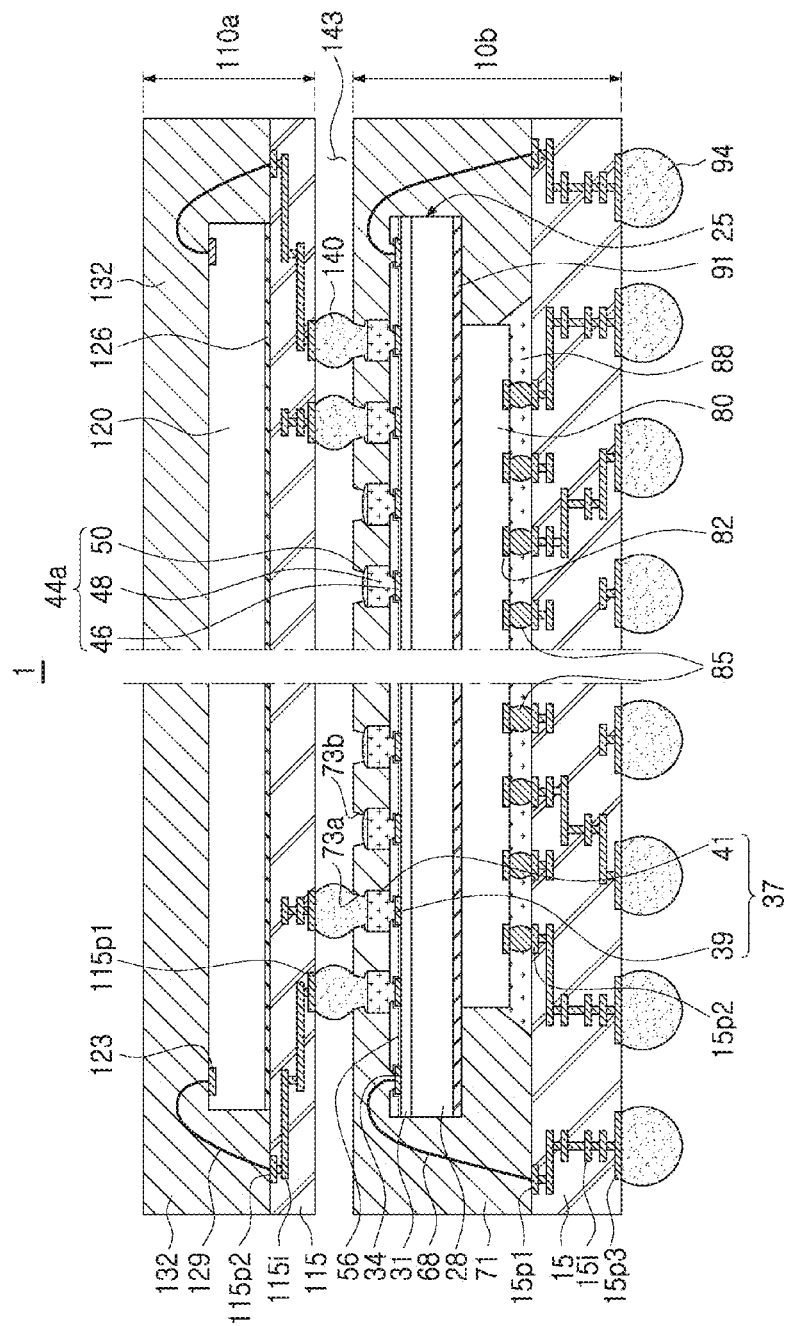
FIG. 5 is a cross-sectional view illustrating a modified example of a semiconductor package according to some example embodiments of the inventive concepts.

In a modified example, referring to FIG. 5, a lower structure 10b of the semiconductor package 1 may include the heat sink structure 44a in which a top surface of the capping pattern 50 is exposed. For example, the lower mold layer 71 may further have a second opening 73b exposing at least a portion of the top surface of the capping pattern 50 of the heat sink structure 44a and thus exposing at least a portion of the heat sink structure 44a. Accordingly, since the capping pattern 50 of the heat sink structure 44a may be exposed by the second opening 73b of the lower mold layer 71, heat sink characteristics of the lower structure 10b may be improved.

Figure 6:
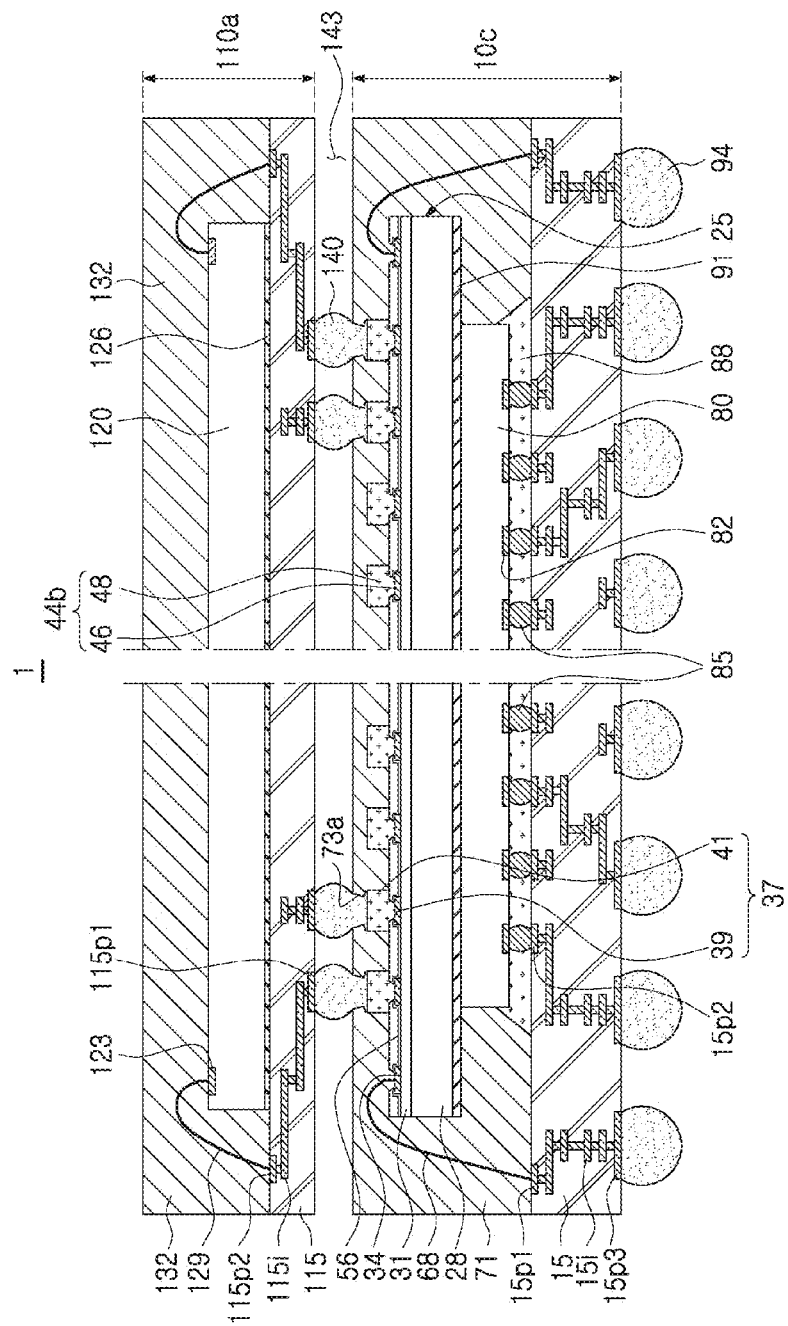
FIG. 6 is a cross-sectional view illustrating a modified example of a semiconductor package according to some example embodiments of the inventive concepts.

In a modified example, referring to FIG. 6, a lower structure 10c of the semiconductor package 1 may include a heat sink structure 44b including the first heat sink pattern 46, corresponding to the first pad 39 of the pad structure 37, and the second heat sink pattern 48 corresponding to the second pad 41 of the pad structure 37. A top surface of the second heat sink pattern 48 of the heat sink structure 44b may be in direct contact with the lower mold layer 71.

Figure 7:
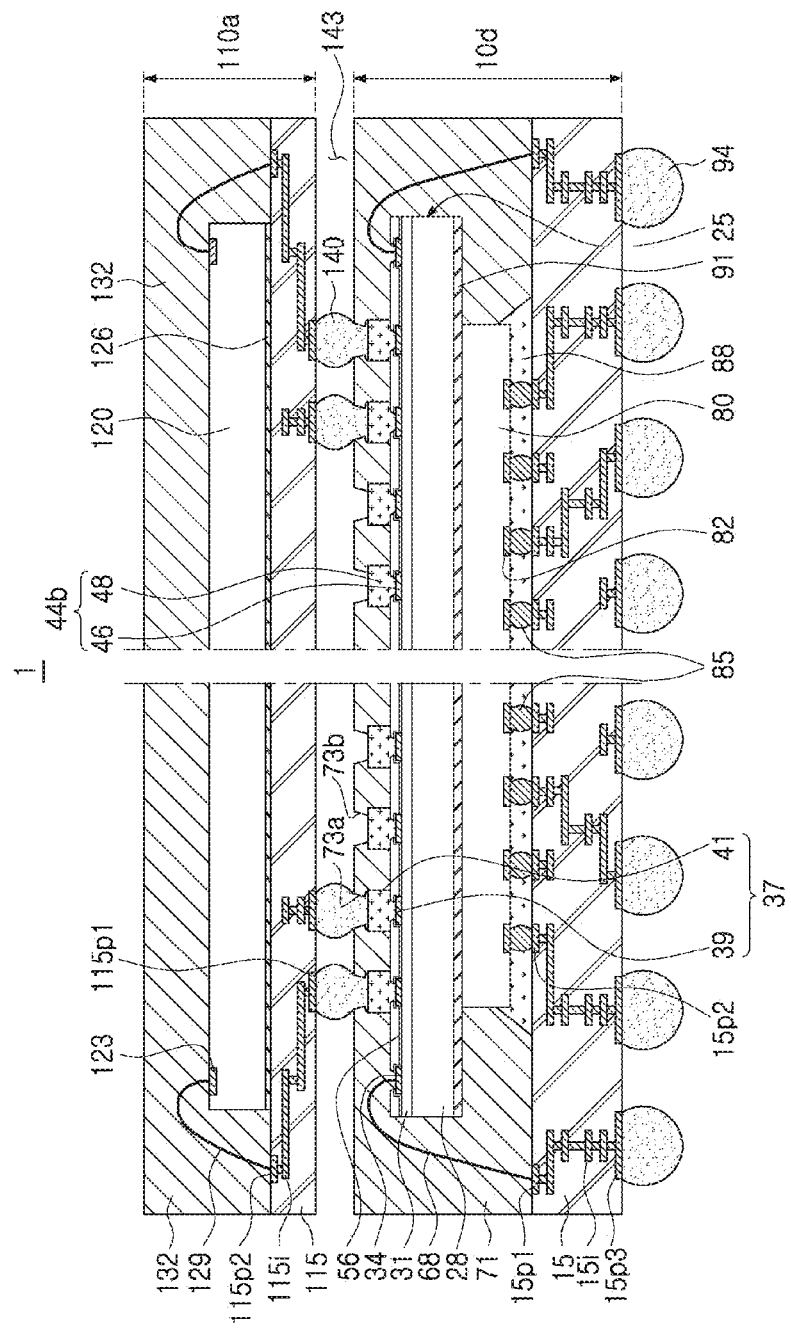
FIG. 7 is a cross-sectional view illustrating a modified example of a semiconductor package according to some example embodiments of the inventive concepts.

In a modified example, referring to FIG. 7, a lower structure 10d of the semiconductor package 1 may include a heat sink structure 44b in which a top surface of the second heat sink pattern 48 is exposed. For example, the lower mold layer 71 may include the second opening 73b exposing at least a portion of the top surface of the second heat sink pattern 48 of the heat sink structure 44b. Accordingly, since the second heat sink pattern 48 of the heat sink structure 44a may be exposed by the second opening 73b of the lower mold layer 71, heat sink characteristics of the lower structure 10d may be improved.

Figure 8:
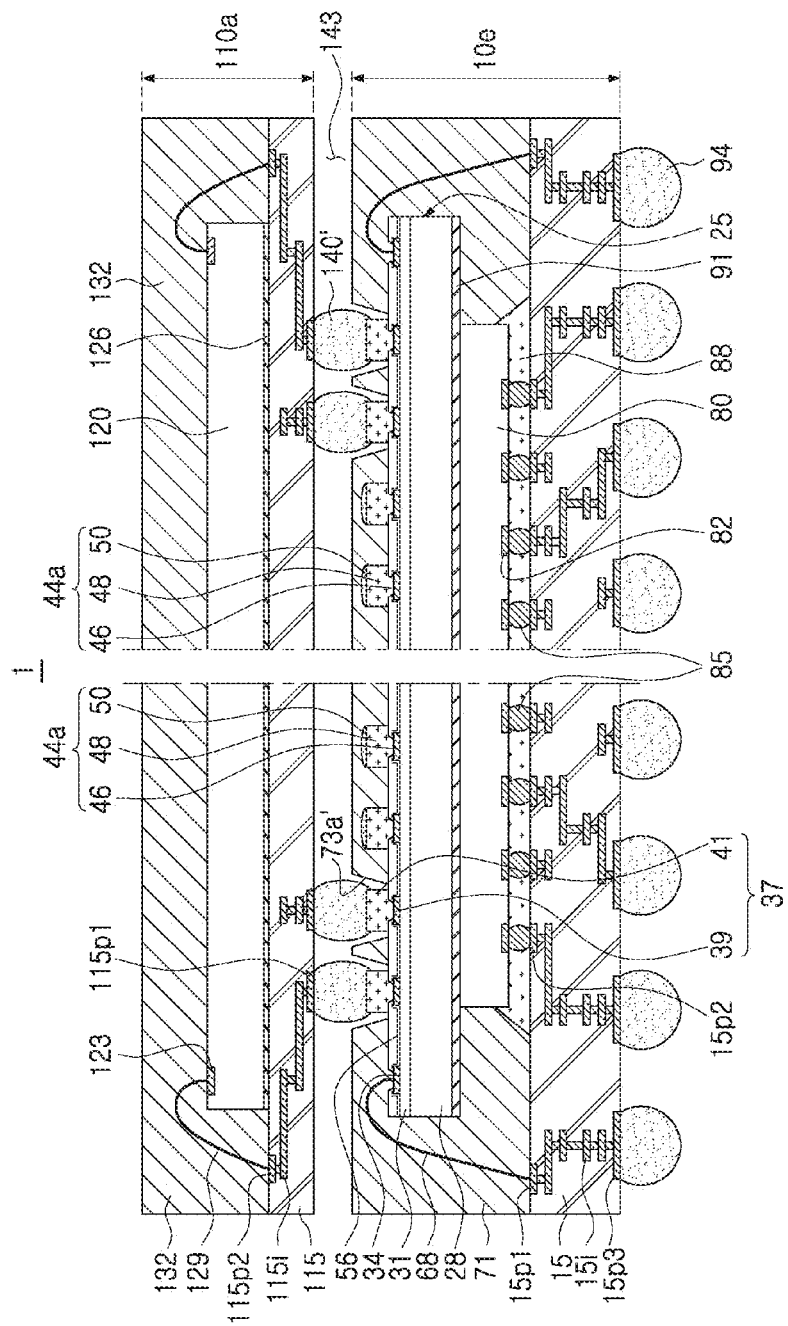
FIG. 8 is a cross-sectional view illustrating a modified example of a semiconductor package according to some example embodiments of the inventive concepts.
Figure 9:
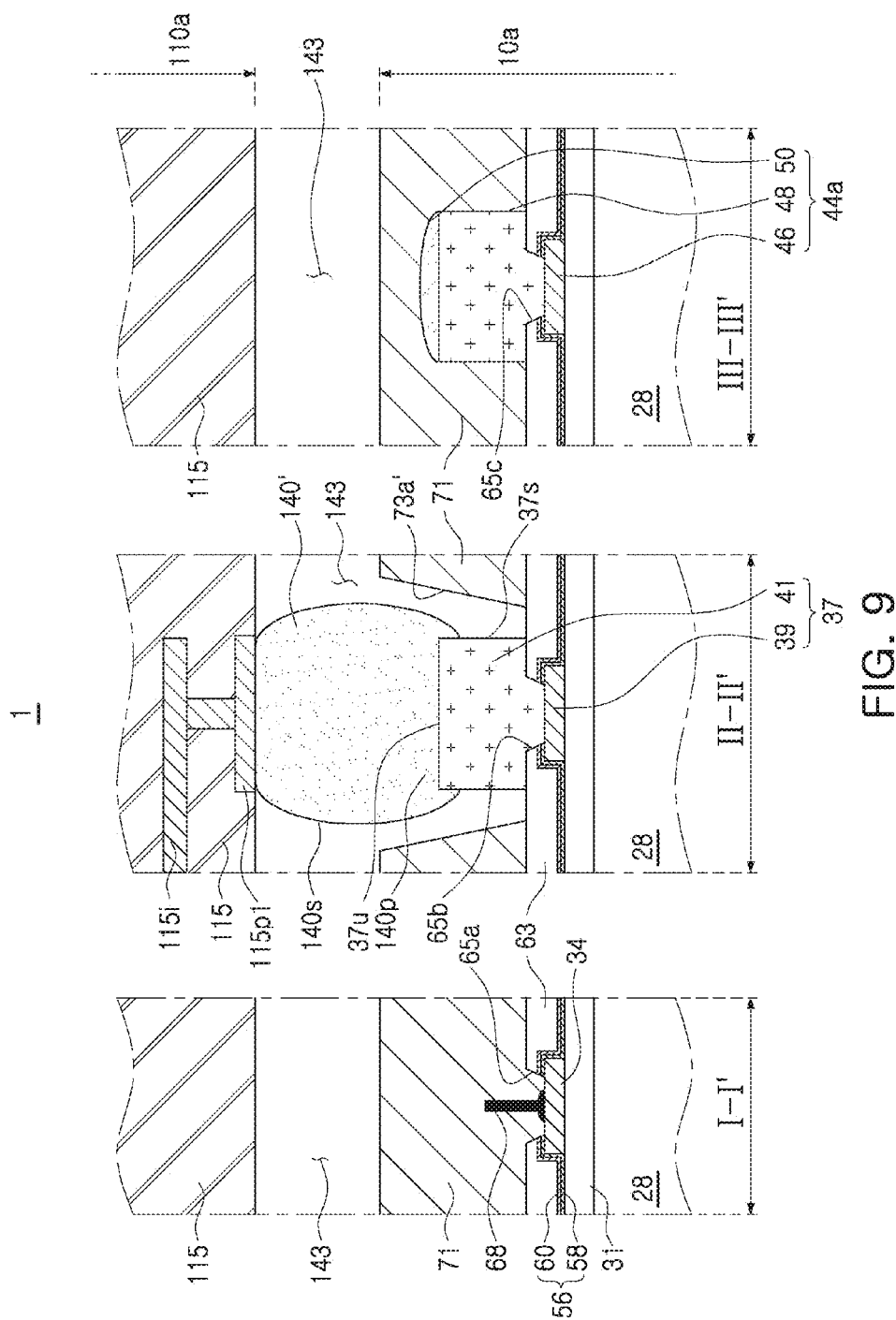
FIG. 9 is a partially enlarged cross-sectional view of a region, taken along lines I-I', II-II', and III-III' in FIG. 3, illustrating a modified example of a semiconductor package according to some example embodiments of the inventive concepts.

In a modified example, referring to FIGS. 8 and 9, a lower structure 10e of the semiconductor package 1 may include a pad structure 37 having a side surface 37s having at least a portion exposed. For example, the lower mold layer 71 may have a first opening 73a' having a width greater than a width of the second pad 41 of the pad structure 37, such that the first opening 73a' exposes a top surface 37u of the pad structure 37 from the lower mold layer 71 and further exposes at least a portion of a side surface 37s of the pad structure 37 from the lower mold layer 71. A side surface of the second pad 41 of the pad structure 37 may be exposed by the first opening 73a' of the lower mold layer 71. The first opening 73a' of the lower mold layer 71 may be exposed to the empty space 143 between the lower structure 10a and the upper structure 110a.

A connection pattern 140' may be in contact with the first upper pad 115p1 of the upper structure 110a while being in contact with a portion of a side surface of the second pad 41 of the pad structure 37 and a top surface of the second pad 41.

The side surface of the second pad 41 of the pad structure 37 and a side surface of the connection pattern 140' may be exposed by the first opening 73a' of the lower mold layer 71 and the empty space 143. Accordingly, heat sink characteristics of the semiconductor package 1, including the lower structure 10e and the connection pattern 140', may be improved together with the heat sink structure 44a.

Figure 10:
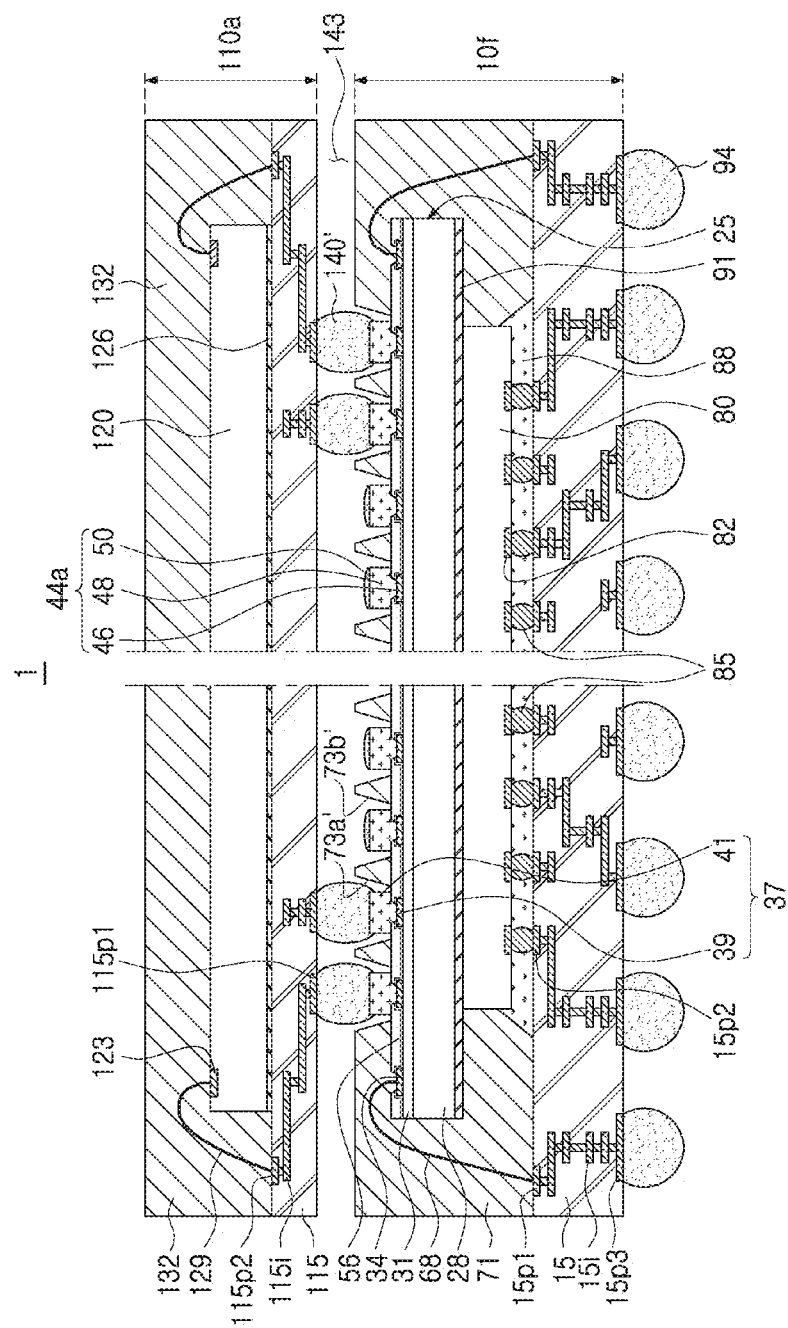
FIG. 10 is a cross-sectional view illustrating a modified example of a semiconductor package according to some example embodiments of the inventive concepts.

In a modified example, referring to FIG. 10, a lower structure 10f of the semiconductor package 1 includes a pad structure 37, having a side surface having at least a portion exposed, and a heat sink structure 44a having a top surface having at least portion exposed. For example, the lower mold layer 71 may include a first opening 73a', having a width greater than a width of the second pad 41 of the pad structure 37, and a second opening 73b' having a width greater than a width of the second heat sink pattern 48 of the heat sink structure 44a. Accordingly, a side surface of the second pad 41 of the pad structure 37 and a side surfaces of the second heat sink pattern 48 and a top surface of the capping pattern 50 may be exposed by the first opening 73a' of the lower mold layer 71.

The first and second openings 73a' and 73b' of the lower mold layer 71 are exposed to the empty space 143 between the lower structure 10a and the upper structure 110a. Accordingly, the heat sink structure 44a and the pad structure 37 may be exposed by the first and second openings 73a' and 73b' of the lower mold layer 71 to improve heat sink characteristics.

Figure 11:
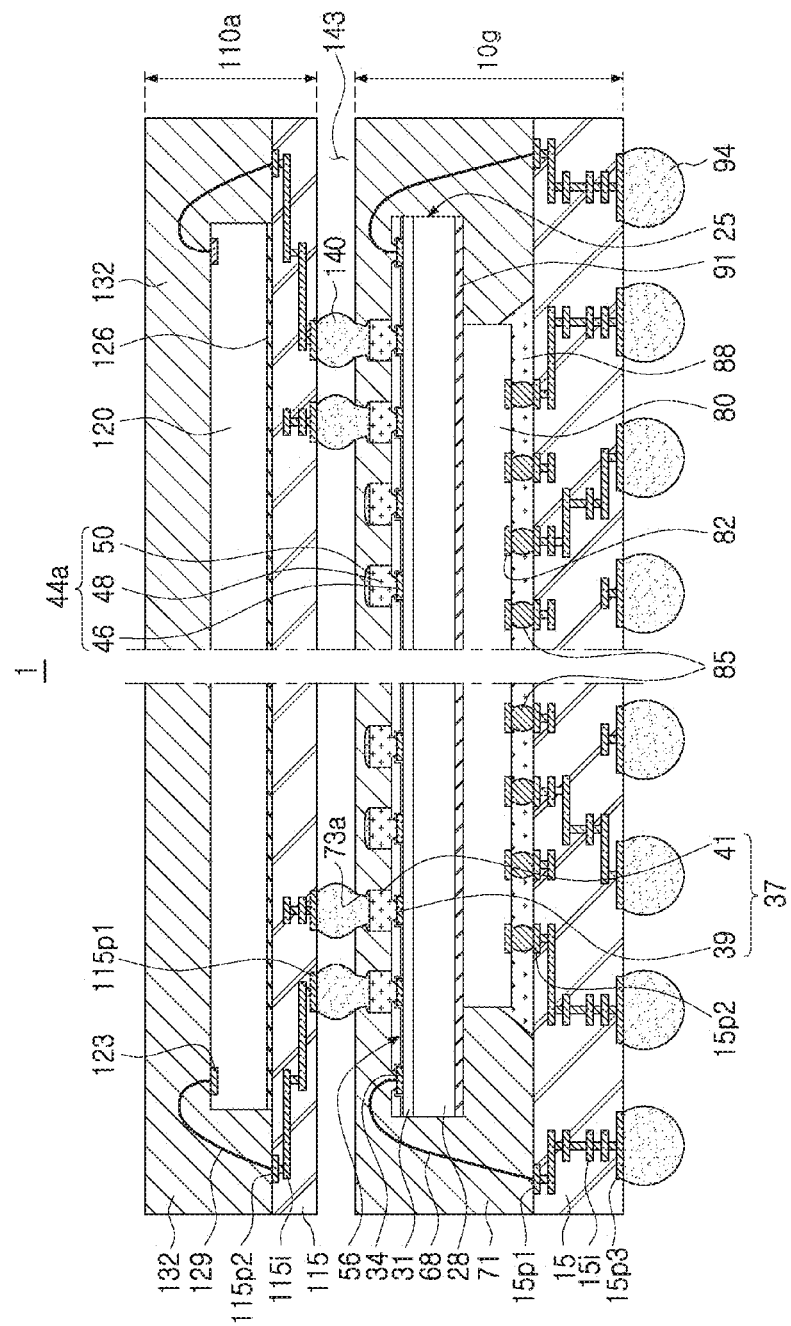
FIG. 11 is a cross-sectional view illustrating a modified example of a semiconductor package according to some example embodiments of the inventive concepts.

In a modified example, referring to FIG. 11, a lower structure 10g of the semiconductor package 1 includes a pad structure 37, having a side surface having at least a portion exposed, and the heat sink structure 44b having the second heat sink pattern 48 having a top surface covered with the lower mold layer 71. The lower mold layer 71 may have a first opening 73a', having a width greater than a width of the second pad 41 of the pad structure 37 and exposing a side surface of the second pad 41, and may directly cover a top surface and a side surface of the second heat sink pattern 48 of the heat sink structure 44b.

Figure 12:
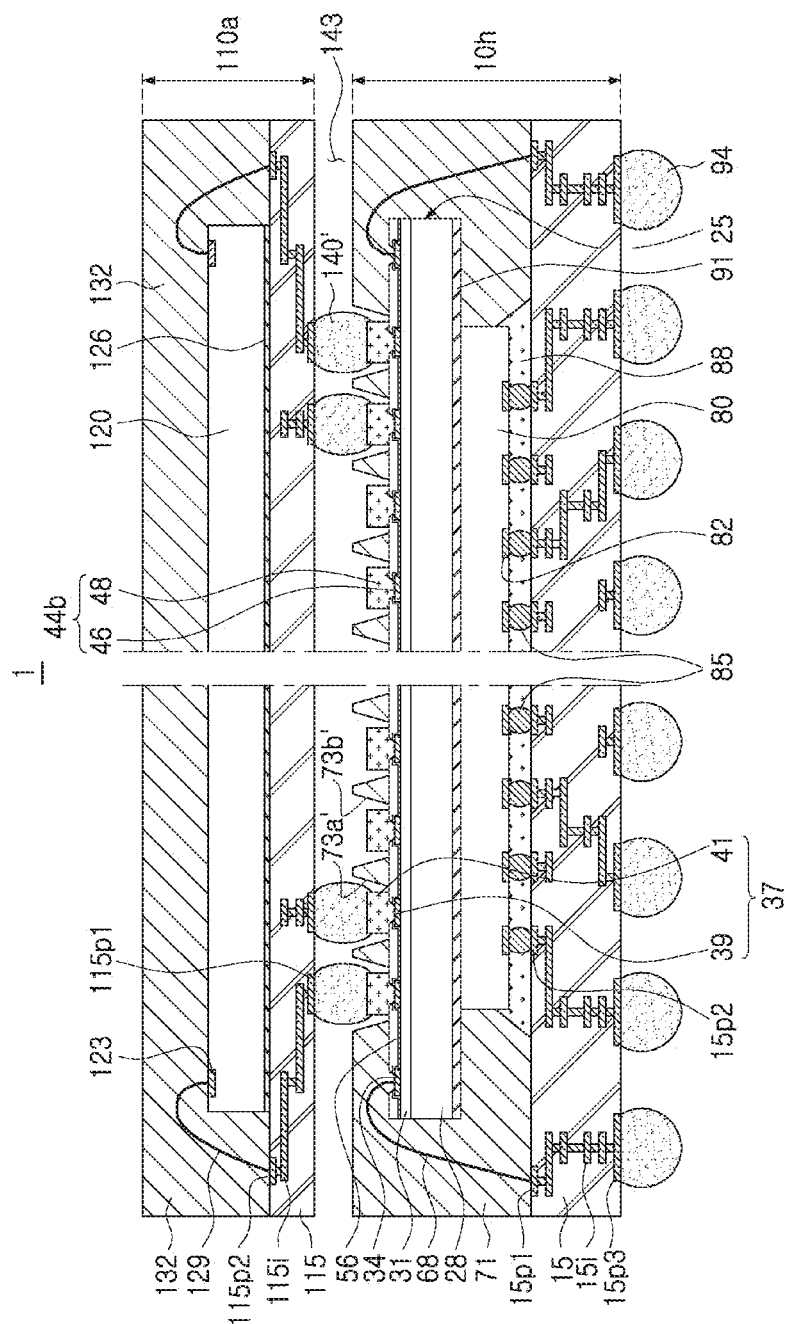
FIG. 12 is a cross-sectional view illustrating a modified example of a semiconductor package according to some example embodiments of the inventive concepts.

In a modified example, referring to FIG. 12, a lower structure 10h of the semiconductor package 1 includes a pad structure 37, having a side surface, having at least a portion exposed, and a heat sink structure 44b having the second heat sink pattern 48 having an exposed side surface and an exposed top surface. For example, the lower mold layer 71 has a first opening 73a', having a width greater than a width of the second pad 41 of the pad structure 37 and exposing a side surface of the second pad 41, and a second opening 73b' having a width greater than a width of the second heat sink pattern 48 of the heat sink structure 44b and exposing a side surface and a top surface of the second heat sink pattern 48. The side surface of the second pad 41 of the pad structure 37 and the side surface and the top surface of the second heat sink pattern 48 may be exposed by the first opening 73a' of the lower mold layer 71.

Figure 13:
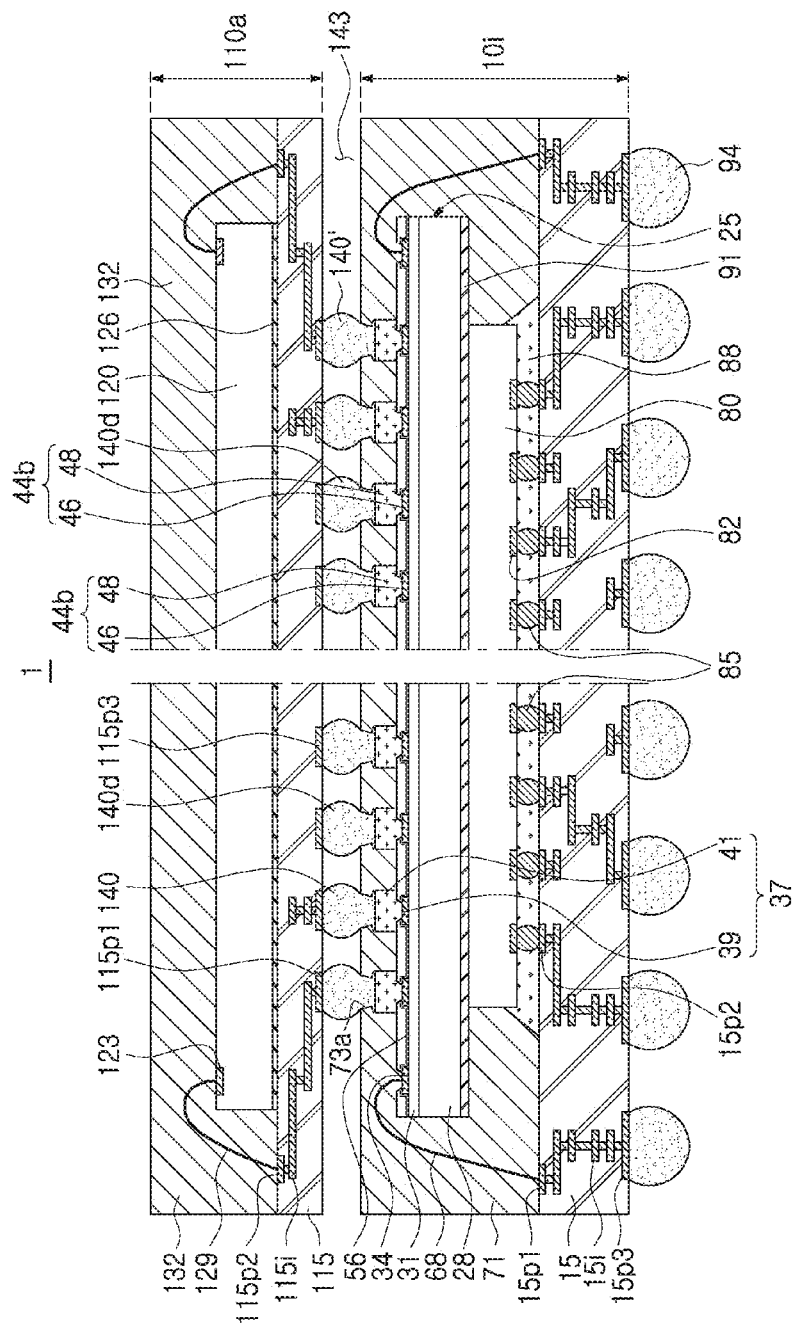
FIG. 13 is a cross-sectional view illustrating a modified example of a semiconductor package according to some example embodiments of the inventive concepts.

In a modified example, referring to FIG. 13, the semiconductor package 1 may further include a dummy pattern 140d between a lower structure 10i and an upper structure 110a. The dummy pattern 140d may be in contact with and connected to (e.g., directly physically connected to) the heat sink structure 44b of the lower structure 10i to release heat of the lower structure 10i. The upper base 115 of the upper structure 110a may further include a dummy pad 115p3. The dummy pad 115p3 may be in contact with the dummy pattern 140d. The dummy pattern 140d may have the same structure as the connection pattern 140. The dummy pattern 140d may include the same material as the connection pattern 140. The dummy pattern 140d may at least partially comprise the same material as the connection pattern 140. The heat sink structure 44b may include the first heat sink pattern 46 and the second heat sink pattern 48. The second heat sink pattern 48 may be in contact with the dummy pattern 140d.

Where an element is described herein to include the "same" material as another element, or where an element is described herein to at least partially comprise the "same" material as another element, it will be understood that the total material composition of the element may be the same as the total material composition of the other element. Similarly, where an element is described herein to include a "different" material than another element or to at least partially comprise a "different" material than another element, it will be understood that the total material composition of the element may be different than the total material composition of the other element.

Figure 14:
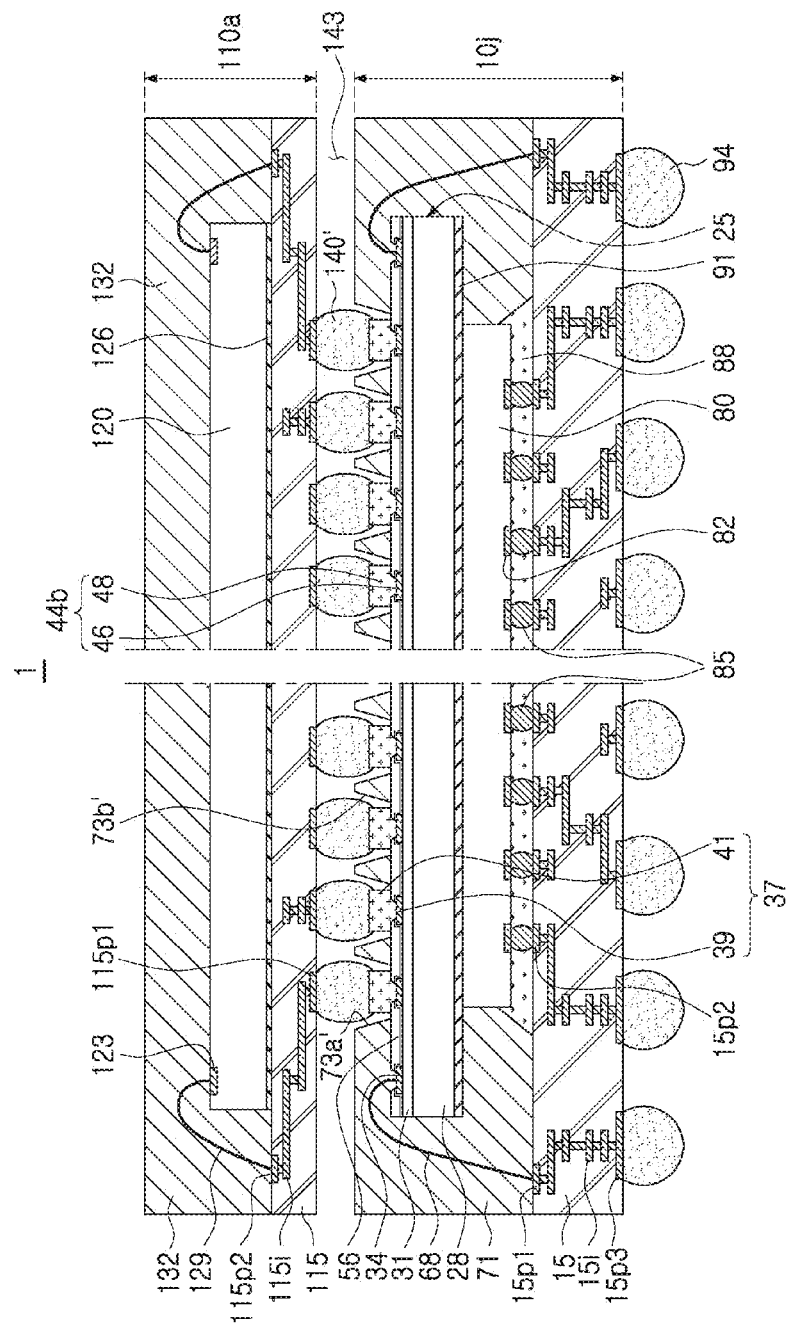
FIG. 14 is a cross-sectional view illustrating a modified example of a semiconductor package according to some example embodiments of the inventive concepts.

In a modified example, referring to FIG. 14, the semiconductor package 1 may include the heat sink structure 44b and the dummy pattern 140d described in FIG. 13. A lower structure 10j of the semiconductor package 1 includes a pad structure 37, having a side surface having at least a portion exposed, and a heat sink structure 44b including the second heat sink pattern 48 having an exposed side surface. For example, the lower mold layer 71 has a first opening 73a' having a width greater than a width of than the second pad 41 of the pad structure 37 and exposing a side surface of the second pad 41, and a second opening 73b' having a width greater than a width of the second heat sink pattern 48 of the heat sink structure 44b and exposing a side surface of the second heat sink pattern 48. Since the first and second openings 73a' and 73b' of the lower mold layer 71 may be exposed to the empty space 143 between the lower structure 10j and the upper structure 110a, side surfaces of the connection pattern 140 and the dummy pattern 140d may be exposed. Accordingly, heat sink characteristic of the semiconductor package 1 may be improved.

Returning to FIG. 2, a plurality of the pad structures 37 may be disposed to surround the dummy area DR. Hereinafter, a modified example of planar disposition of the pad structure 37 and the dummy area DR will be described with reference to FIG. 15.

Figure 15:
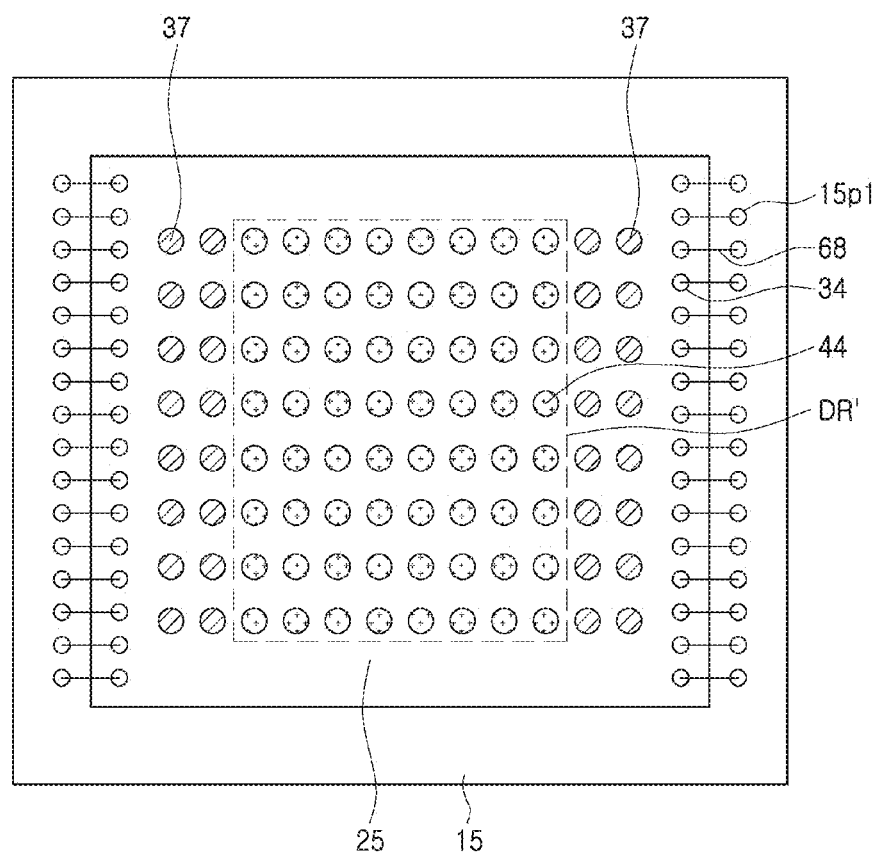
FIG. 15 is a plan view illustrating a modified example of some components of a semiconductor package according to some example embodiments of the inventive concepts.

In a modified example, referring to FIG. 15, a plurality of pad structures 37 may be disposed on both sides of the dummy area DR'. A dummy structure 44 may be disposed in the dummy region DR'. The dummy structure 44 may be the heat sink structure 44a, including the first heat sink pattern 46, the second heat sink pattern 48, and the capping pattern 50 described above, or a heat sink structure 44a including the first heat sink pattern 46 and the second heat sink pattern 48. The dummy region DR' is not limited to the above example.

In the first lower chip 25, the chip bonding pad 34 and the pad structure 37 may be variously modified and disposed according to type or usage of the semiconductor package 1, and the heat sink structure 44a may be disposed in various forms in a dummy region DR' in which the chip bonding pad 34 and the pad structure 37 are not disposed.

Figure 16:
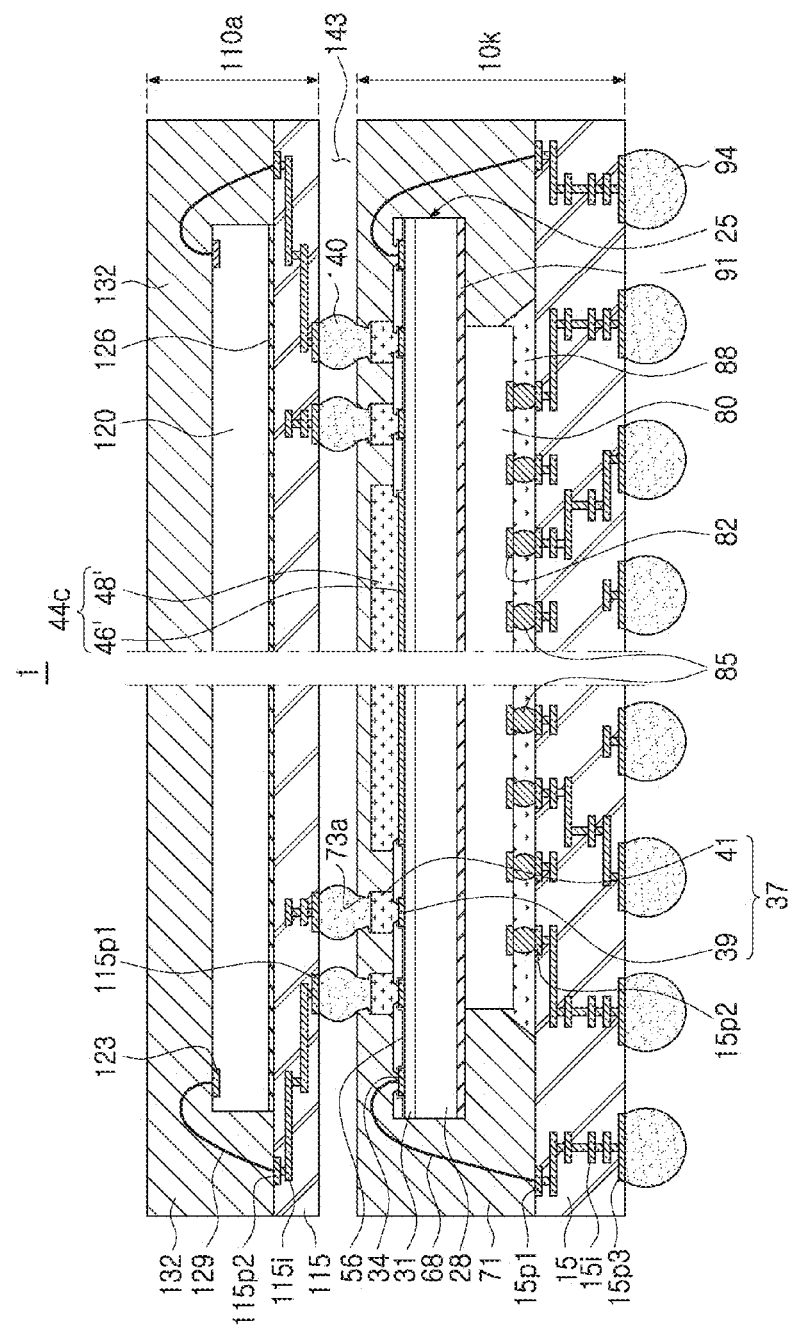
FIG. 16 is a cross-sectional view illustrating a modified example of a semiconductor package according to some example embodiments of the inventive concepts.

In a modified example, referring to FIG. 16, a lower structure 10k of the semiconductor package 1 includes a heat sink structure 44c having a first heat sink pattern 46' and a second heat sink pattern 48'. The first heat sink pattern 46' may be formed on the same level as the first pad 39 of the pad structure 37. The first heat sink pattern 46' may include the same material as the first pad 39. The first heat sink pattern 46' may at least partially comprise the same material as the first pad 39. The second heat sink pattern 48' may be disposed on the same level as the second pad 41 of the pad structure 37. The second heat sink pattern 48' may include the same material as the second pad 41. The second heat sink pattern 48' may at least partially comprise the same material as the second pad 41. Any one of the heat sink structures 44c may have a size larger than a size of any one of the pad structures 37. Examples of the heat sink structure 44c will be described with reference to FIGS. 17A to 17C.

Figure 17A:
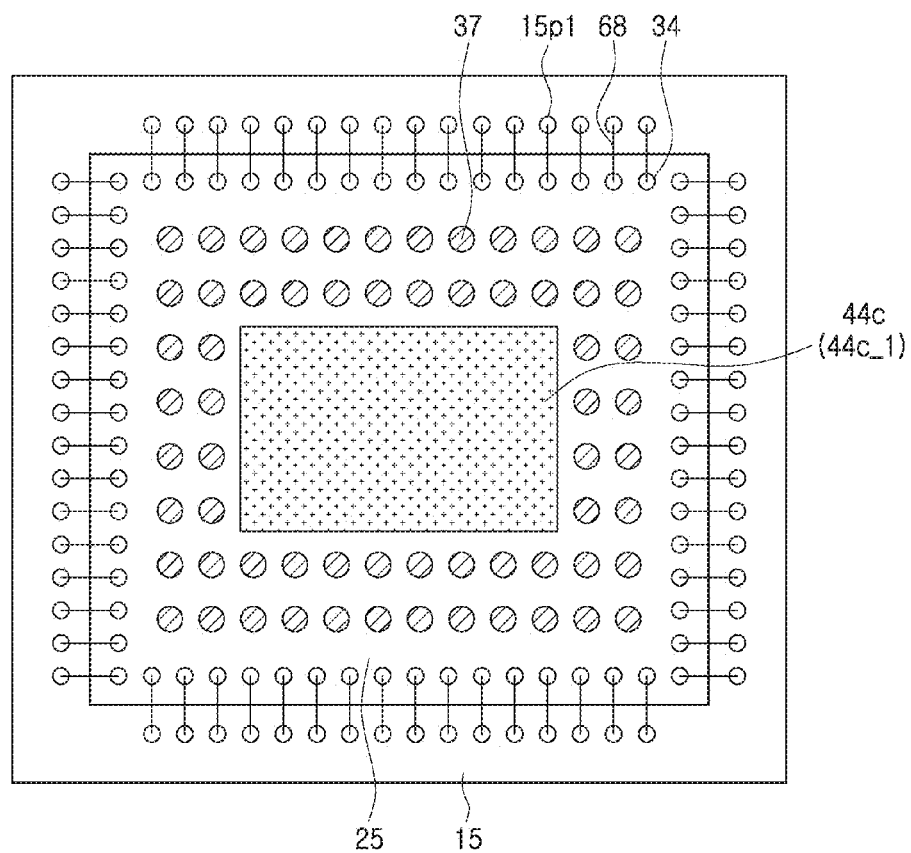
FIG. 17A is a plan view illustrating a modified example of some components of a semiconductor package according to some example embodiments of the inventive concepts.

In a modified example, referring to FIG. 17A, a heat sink structure 44c_1 may have a plate shape. The heat sink structure 44c_1 may have a larger planar area than any one of the pad structures 37. The heat sink structure 44c may have a greater width than any one of the pad structures 37.

Figure 17B:
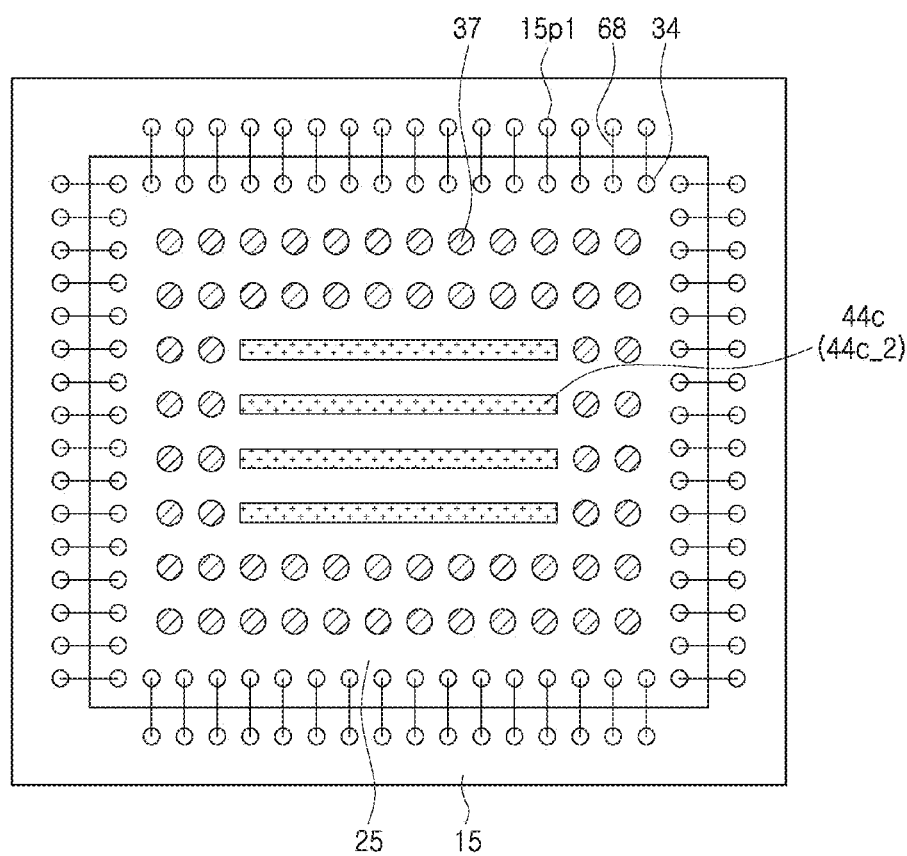
FIG. 17B is a plan view illustrating a modified example of some components of a semiconductor package according to some example embodiments of the inventive concepts.

In a modified example, referring to FIG. 17B, in a plane, a heat sink structures 44c_2 may be in the form of lines spaced apart from each other. Any one of the heat sink structures 44c_2 may be in the form of a line having a length greater than a length of any one of the pad structures 37.

Figure 17C:
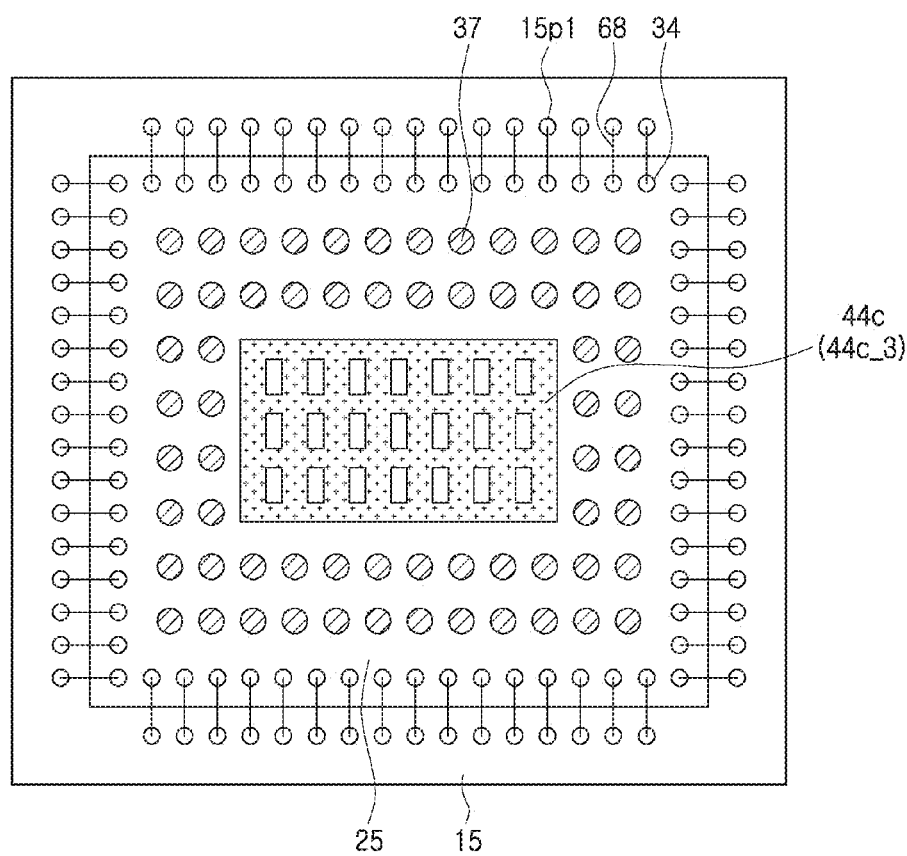
FIG. 17C is a plan view illustrating a modified example of some components of a semiconductor package according to some example embodiments of the inventive concepts.

In a modified example, referring to FIG. 17C, in the plane, s heat sink structure 44c_3 may have a mesh shape.

Figure 18:
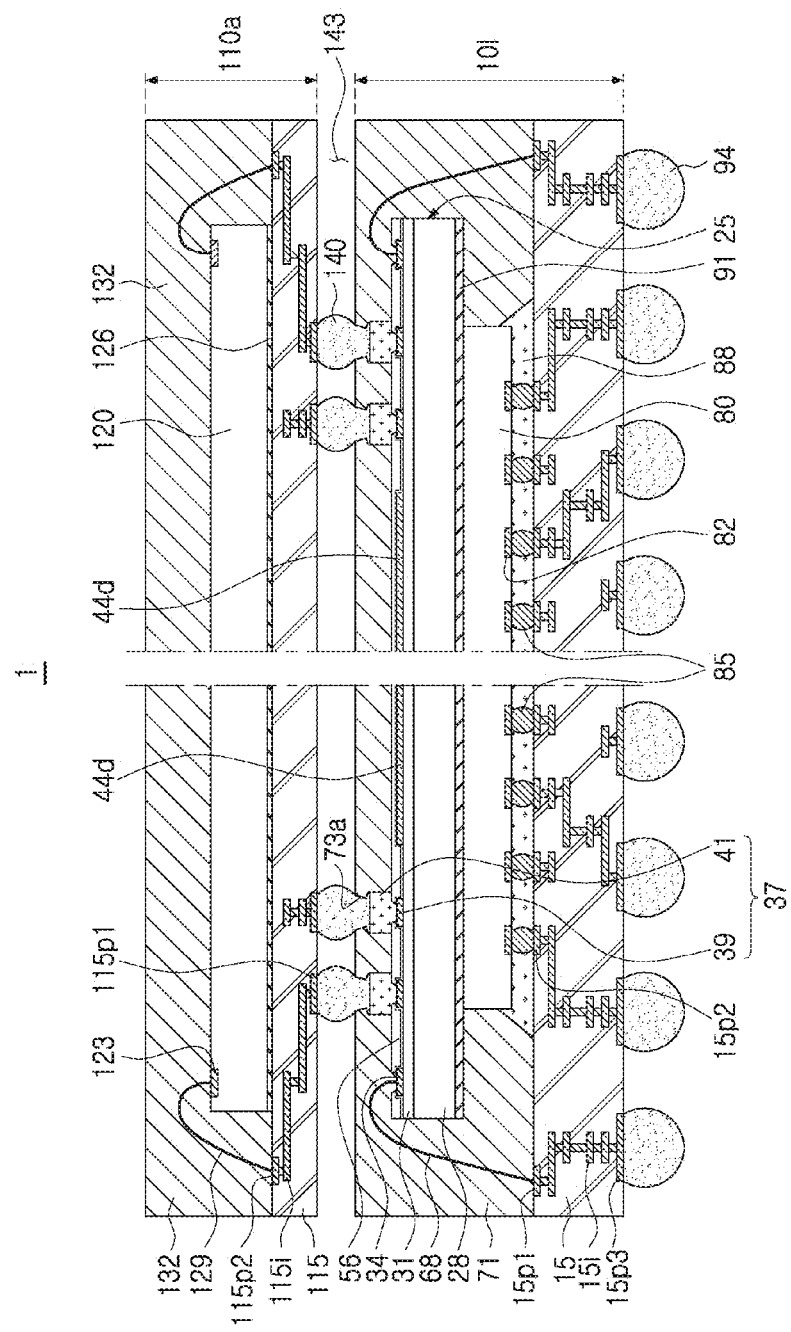
FIG. 18 is a cross-sectional view illustrating a modified example of a semiconductor package according to some example embodiments of the inventive concepts.

In a modified example, referring to FIG. 18, a lower structure 10l of the semiconductor package 1 may be disposed on the same level as the first pad 39 of the pad structure 37 and may include a heat sink structure 44d formed of the same material as the first pad 39. A top surface of the heat sink structure 44d may be covered with the intermediate layer 56 and the upper layer 63.

Figure 19:
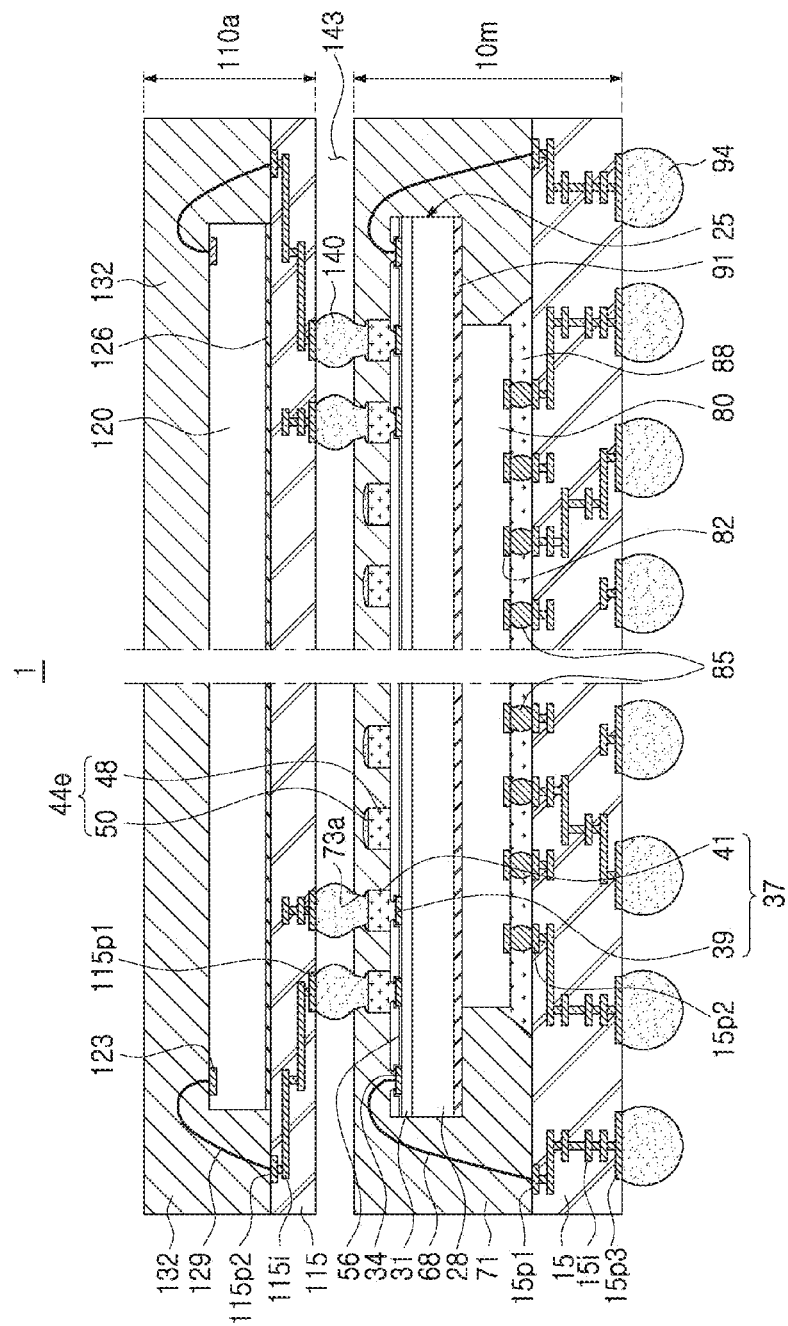
FIG. 19 is a cross-sectional view illustrating a modified example of a semiconductor package according to some example embodiments of the inventive concepts.

In a modified example, referring to FIG. 19, a lower structure 10m of the semiconductor package 1 may include a heat sink structure 44e disposed on the upper layer 63. A bottom surface of the heat sink structure 44e may be in contact with the upper layer 63. The heat sink structure 44e includes a heat sink pattern 48e, disposed on the same level as the second pad 41 of the pad structure 37 and formed of the same material as the second pad 41, and a capping pattern 50 on the heat sink pattern 48e.

Figure 20:
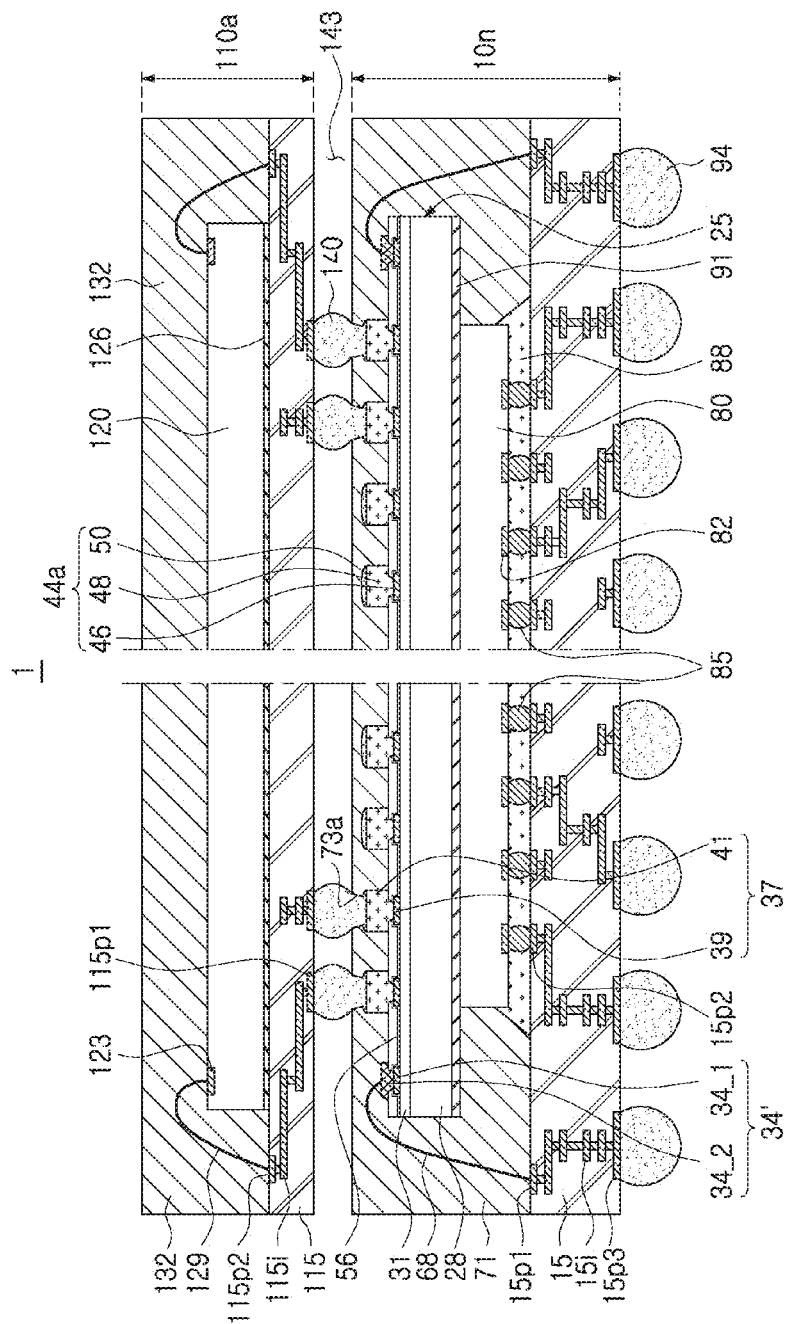
FIG. 20 is a cross-sectional view illustrating a modified example of a semiconductor package according to some example embodiments of the inventive concepts.
Figure 21:
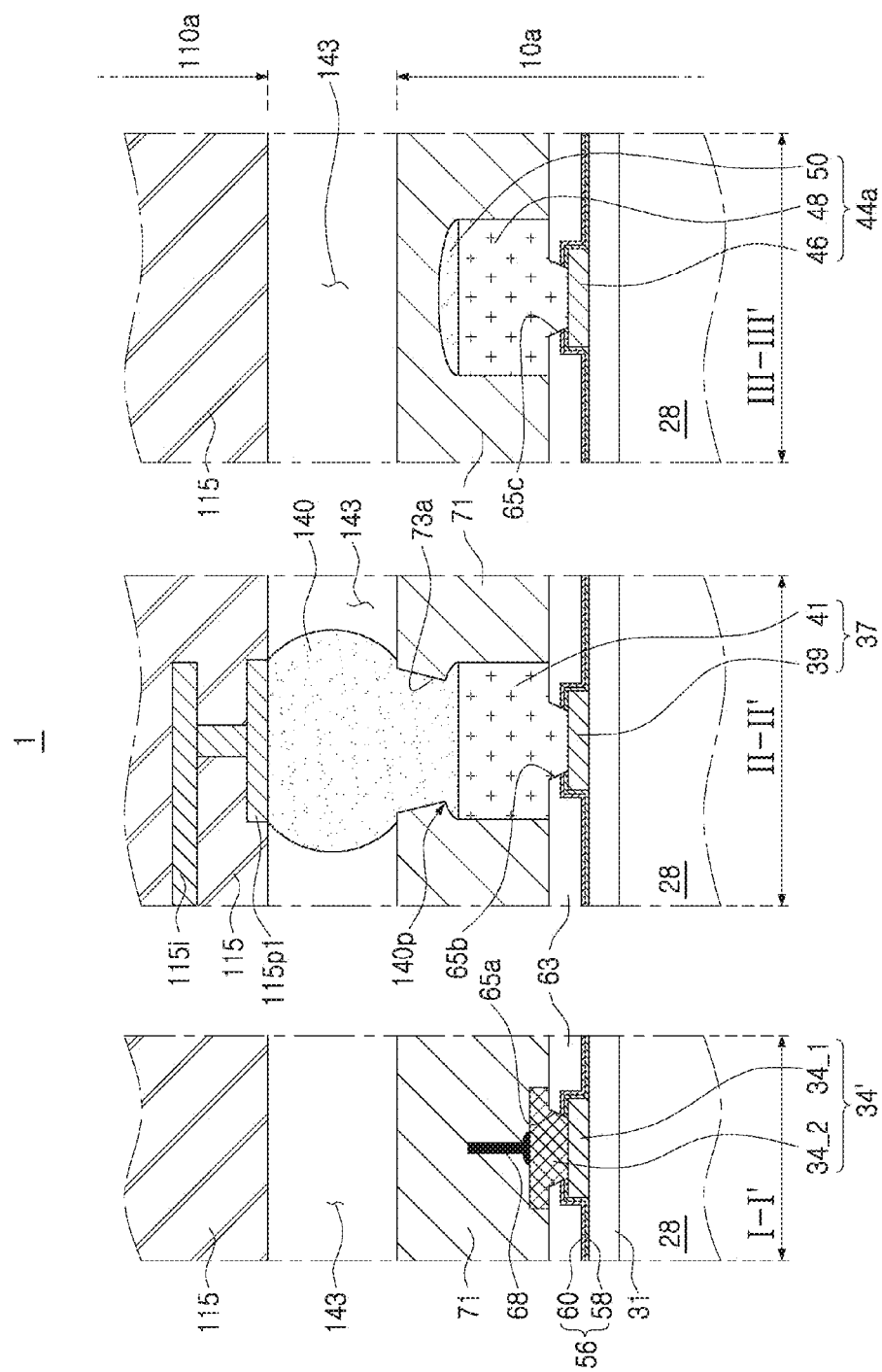
FIG. 21 is a partially enlarged cross-sectional view of a region, taken along lines I-I', II-II', and III-III' in FIG. 3, illustrating a modified example of a semiconductor package according to some example embodiments of the inventive concepts.
Figure 22:
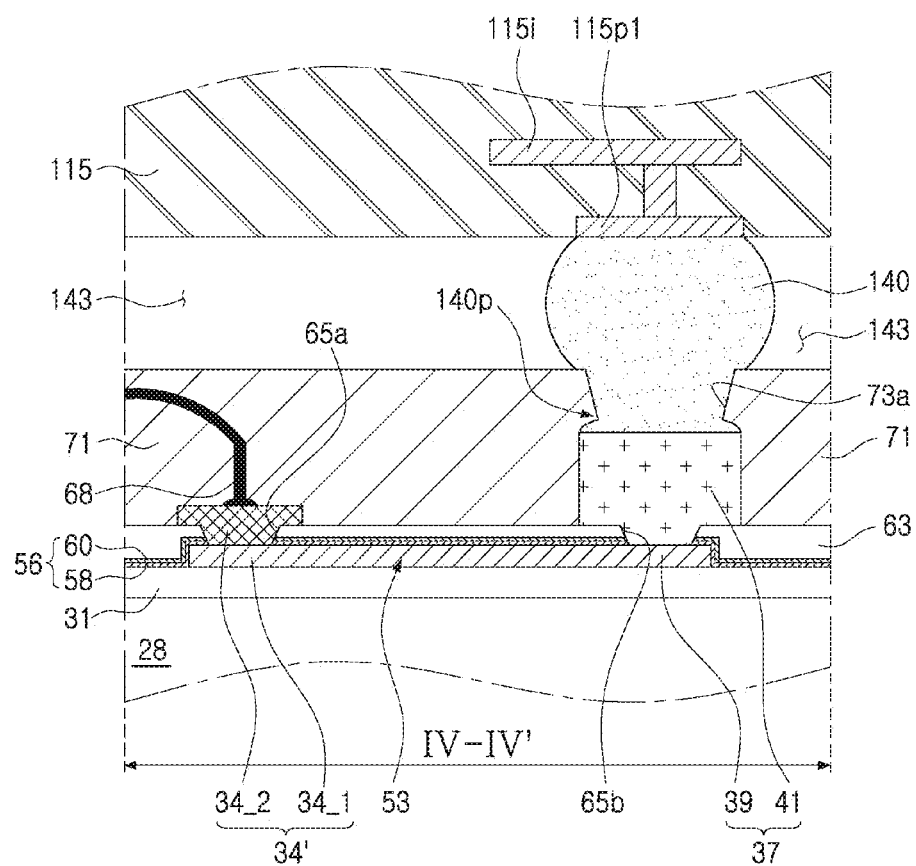
FIG. 22 is a partially enlarged cross-sectional view of a region, taken along line IV-IV' in FIG. 3, illustrating a modified example of a semiconductor package according to some example embodiments of the inventive concepts.

In a modified example, referring to FIGS. 20, 21, and 22, a lower structure 10n of the semiconductor package 1 includes a chip bonding pad 34' including a first bonding pad 34_1 and a second bonding pad 34_2 on the first bonding pad 34_1. The above-described wire 68 may be bonded to the second bonding pad 34_2 of the chip bonding pad 34'.

The second bonding pad 34_2 may have a thickness smaller than the thickness of the second pad 41 of the pad structure 37.

The above-described redistribution line 53 may be formed integrally with the first bonding pad 34_2 and the first pad 39. Accordingly, the redistribution line 53, the first bonding pad 34_2 and the first pad 39 may be disposed on the same level and may at least partially comprise the same material.

In the example embodiments described with reference to FIGS. 1 to 22, the first lower chip 25 may be disposed on the substrate 28 and may include the chip bonding pad 34, the pad structure 37, and the lower layer 31 disposed on (e.g., below) the redistribution line 53 and the heat sink structure 44a. An example of the first lower chip 25 will be described with reference to FIG. 23.

Referring to FIG. 23, in an example, the lower layer 31 of the first lower chip 25 may include an insulating material. The lower layer 31 may at least partially comprise an insulating material (for example, a silicon oxide, or the like) to insulate the chip bonding pad 34, the pad structure 37, and the heat sink structure 44a from the substrate 28. The first lower chip 25 may be an interposer chip.

In another example, the first lower chip 25 may further include lower chip patterns 32 disposed in the lower layer 31. Some of the lower chip patterns 32 may be electrically connected to the pad structure 37. The lower chip patterns 32 may constitute an integrated circuit or a circuit wiring. Accordingly, the first lower chip 25 may be a semiconductor chip.

In another example, the lower chip patterns 32 may constitute a passive element such as a capacitor, a resistor, an inductor, or the like. Accordingly, the first lower chip 25 may be an interposer chip including a passive element.

In the embodiments described with reference to FIGS. 1 to 22, the upper structure 110a may include the upper chip 120 mounted on the upper base 115 by wire bonding. A modified example of the upper structure 110a will be described with reference to FIG. 24.

In the modified example, referring to FIG. 24, the upper structure 110b may include an upper base 115' and upper chips 120a, 120b, 120c, and 120c mounted on the upper base 115' in a flip chip manner.

In an example, a plurality of the upper chips 120a, 120b, 120c, and 120d may be stacked. For example, the upper chips 120a, 120b, 120c and 120d may include a first upper chip 120a, a second upper chip 120b, a third upper chip 120c, and a fourth upper chip 120d, which are sequentially stacked. The upper structure 110b may include a first bump 124a, disposed between the first upper chip 120a and the upper base 115' to connect a pad 121a of the first upper chip 120a and a pad 115p2' of the upper base 115' to each other, and a second bump 124b disposed between the first to fourth upper chips 120a, 120b, 120c, and 120d to connect adjacent upper chips to each other. The second bumps 124b may be in contact with pads 121b of upper chips adjacent to each other. The first to fourth upper chips 120a, 120b, 120c and 120d may be electrically connected through through-electrodes 125 in the first to third upper chips 120a, 120b, and 120c.

The upper structure 110b may further include an adhesive layer 127 be disposed between the first upper chip 120a and the upper base 115' and disposed between the first to fourth upper chips 120a, 120b, 120c, and 120d. The upper structure 110b may further include an upper mold layer 132' covering the upper chips 120a, 120b, 120c and 120d on the upper base 115'.

In a modified example, referring to FIG. 25, an upper structure 110c may be a semiconductor chip. For example, the upper structure 110c may include a semiconductor substrate 112 and a front structure 113. The front structure 113 may include a semiconductor integrated circuit. The front structure 113 may include an upper pad 115p' in contact with the above-described connection pattern 140.

FIGS. 26A to 26C, 27A, and 27B are cross-sectional views illustrating an example of a method of fabricating a semiconductor package according to some example embodiments of the inventive concepts.

First, an example of a method of forming the first lower chip 25 will be described with reference to FIGS. 26A to 26C.

Figure 26A:
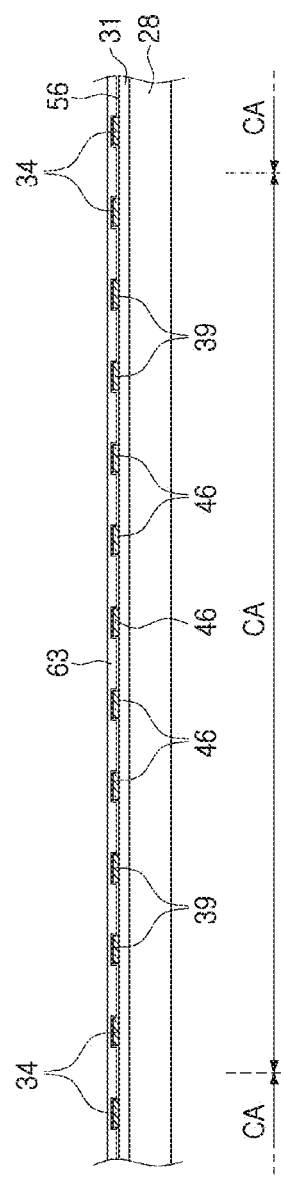

Referring to FIG. 26A, a lower layer 31 may be formed on a substrate 28. The substrate 28 may be a semiconductor wafer having a plurality of chip areas CA. For example, the substrate 28 may be a silicon substrate. A chip bonding pad 34, a first pad 39, and a first heat sink pattern 46 may be formed on the lower layer 31. The chip bonding pad 34, the first pad 39, and the first heat sink pattern 46 may be simultaneously formed and may at least partially comprise the same material (for example, aluminum).

An intermediate layer 56 and an upper layer 63 may be sequentially formed on the lower layer 31 to cover the chip bonding pad 34, the first pad 39, and the first heat sink pattern 46 are sequentially formed on the lower layer 31. The intermediate layer 56 may at least partially comprise an insulating material such as a silicon oxide and a silicon nitride. The upper layer 63 may at least partially comprise a material such as polyimide or the like.

Figure 26B:
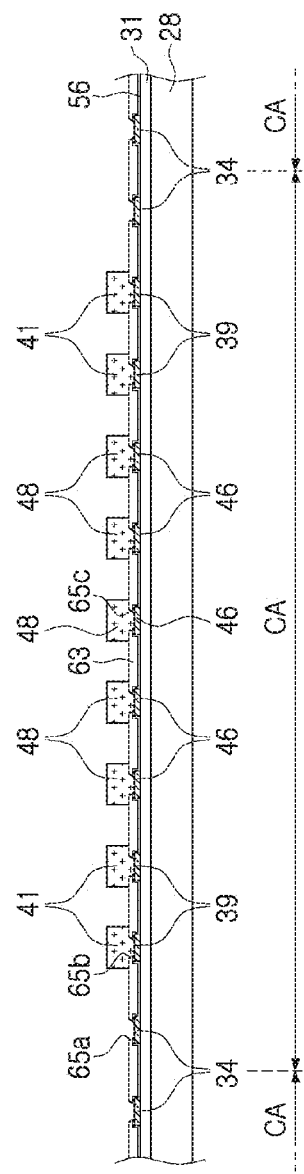

Referring to FIG. 26B, the upper layer 63 and the intermediate layer 56 are patterned to form a first opening 65a exposing a top surface of the chip bonding pad 34, a second opening 65b exposing a top surface of the first pad 39, and a third opening 65c exposing the first heat sink pattern 46. A second pad 41 and a second heat sink pattern 48 may be formed on the first pad 39 and the first heat sink pattern 46, respectively. The second pad 41 and the second heat sink pattern 48 may at least partially comprise the same material (for example, copper, or the like).

Referring to FIG. 26C, capping patterns 50 may be formed on top surfaces of the second pad 41 and the second heat sink pattern 48. The capping patterns 50 may at least partially comprise a solder material. Accordingly, the heat sink structure 44a including the first heat sink pattern 469, the second heat sink pattern 48, and the capping pattern 50 may be formed. A pad structure 37, including the first pad 39 and the second pad 41, may be formed on the substrate 28. The capping pattern 50 on the pad structure 37 may be used to connect the pad structure 37 to another structure.

The plurality of chip regions (CA in FIG. 26A and FIG. 26B) may be separated by performing a cutting process of cutting the substrate 28. Accordingly, the separated first lower chip 25 may be formed. As a result, the first lower chip 25 may be prepared.

Figure 27A:
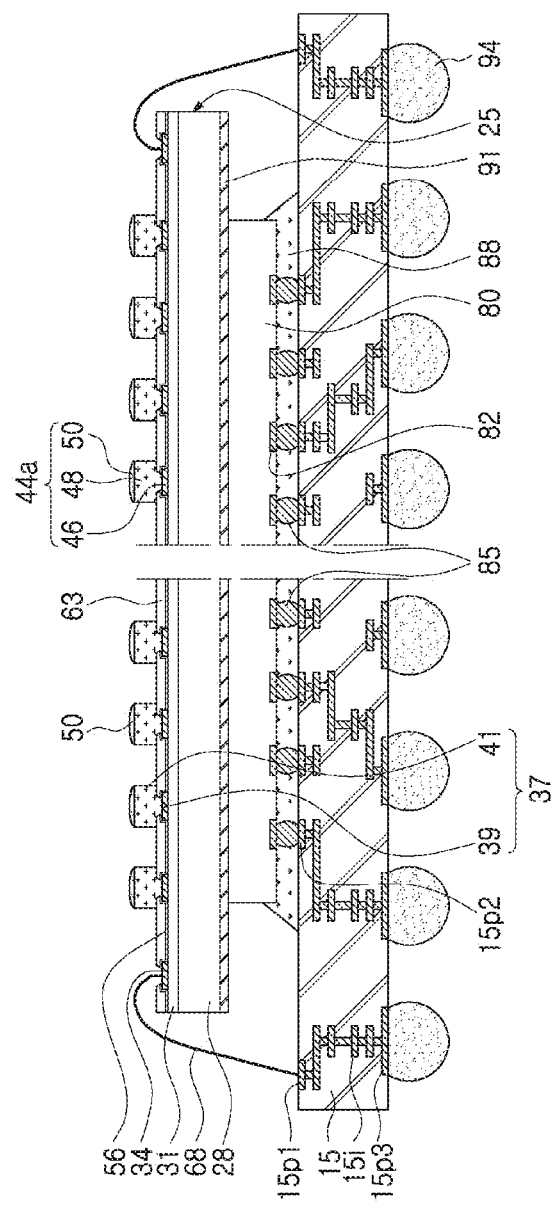

Referring to FIG. 27A, a second lower chip 80 may be mounted on a lower base 15 on which the solder ball 94 is formed. The second lower chip 80 may be mounted on the lower base 15 in a flip chip manner.

The first lower chip 25 may be bonded onto the second lower chip 80. For example, an adhesive layer 91 may be adhered to a bottom surface of the first lower chip 25 and to a top surface of the second lower chip 80. In an example, the adhesive layer 91 may be formed on a bottom surface of the substrate 28 before the cutting process of separating the plurality of chip areas (CA of FIGS. 26A and 26B) described in FIG. 26C.

A wire bonding process may be performed in such a manner that a wire 68 is formed to connect the chip bonding pad 34 of the first lower chip 25 and the first base pad 15p1 of the lower base 15 to each other.

Figure 27B:
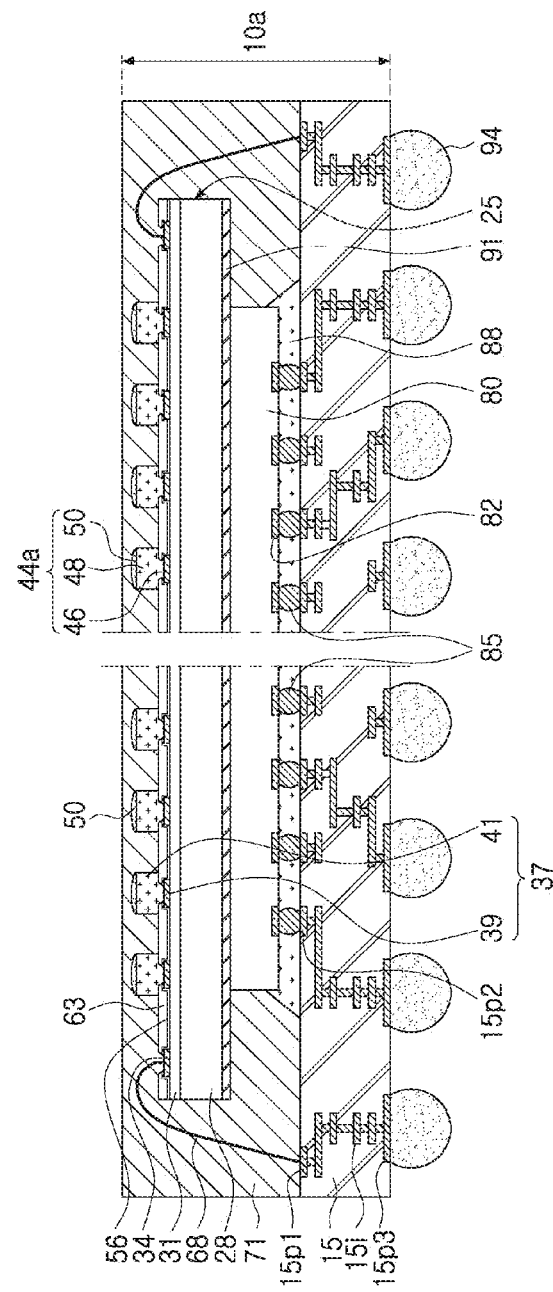

Referring to FIG. 27B, a lower mold layer 71 may be formed on the lower base 15 to cover an upper portion of the first lower chip 25, side surfaces of the first and second lower chips 25 and 80, and the wires 68. Accordingly, a lower structure 10a may be formed on the lower base 15 to extend to the lower mold layer 71.

Returning to FIG. 1, the lower mold layer 71 may be patterned in such a manner that a first opening 73a is formed to expose the capping pattern (50 in FIG. 27B) on the pad structure 37. The same upper structure 110a as described in FIG. 1 may be prepared. The upper structure 110a may be a semiconductor package or a semiconductor chip.

After a solder ball is formed on a lower portion of the upper structure 110a, the solder ball on the lower portion of the upper structure 110a and the capping pattern (50 in FIG. 27B) of the pad structure 37, exposed by the first opening 73a of the lower mold layer 71, may be connected to each other. For example, the solder ball on the lower portion of the upper structure 110a and the capping pattern (50 in FIG. 27B) of the pad structure 37, exposed by the first opening 73a of the lower mold layer 71, may be formed as a connection pattern 140 by a solder reflow process. Accordingly, the semiconductor package 1 including the lower structure 10a and the upper structure 110a, connected to each other by the connection pattern 140, may be formed.

In some example embodiments, the above-described semiconductor package 1 may include the heat sink structures 44a, 44b, 44c, 44d, and 44e, as described above. The heat sink structures 44a to 44e may release heat, generated in the lower structures 10a to 10n, to the outside of the lower structures 10a to 10n. For example, the heat sink structures 44a to 44e may serve to efficiently release the heat in the first lower chip 25 to the empty space 143 between the lower structure 10a and the upper structures 110a to 110c.

The second lower chip 80 in the lower structures 10a to 10n may be surrounded by the first lower chip 25, the lower base 15, and the lower mold layer 71. Such heat, generated in the second lower chip 80, may be more effectively released by the heat sink structures 44a to 44e. Thus, the heat sink structures 44a to 44e in some example embodiments may more effectively release the heat, generated in the lower structure 10a in the semiconductor package 1, to the outside. As a result, deterioration in performance of the semiconductor package 1, caused by the heat generated in the semiconductor package 1, may be prevented or significantly reduced.

In some example embodiments of the inventive concepts, in a semiconductor package including a lower structure and an upper structure, a heat sink structure may be included in the lower structure to efficiently release heat generated in the lower structure. The heat in the lower structure may be released using the heat sink structure to prevent or significantly reduce deterioration in performance of the semiconductor package.

While some example embodiments have been shown and described above, it will be apparent to those skilled in the art that modifications and variations could be made without departing from the scope of the inventive concepts as defined by the appended claims.

What is claimed is:

1. A semiconductor device, comprising:
    a lower semiconductor package, the lower semiconductor package including a lower base and a first lower chip on the lower base, the first lower chip including a chip pad, a pad structure, a heat sink structure and a redistribution line configured to electrically connect the chip pad and the pad structure to each other;
    an upper semiconductor package including at least one chip and on the lower semiconductor package; and
    a connection pattern between the lower semiconductor package and the upper semiconductor package, the connection pattern configured to electrically connect the lower semiconductor package and the upper semiconductor package to each other, the connection pattern connected to the upper semiconductor package, the connection pattern extending away from the upper semiconductor package to be connected to the pad structure,
    wherein the chip pad does not overlap the pad structure and the connection pattern in a vertical direction perpendicular to an upper surface of the lower base.

2. The semiconductor device of claim 1, wherein the pad structure includes
    a first pad, and
    a second pad on the first pad,
    a top surface of the second pad of the pad structure is at a higher level than a top surface of the chip pad,
    the top surface of the chip pad is at a same height level as a top surface of the first pad, and
    a bottom surface of the chip pad is at a same height level as a bottom surface of the first pad.

3. The semiconductor device of claim 2, wherein the heat sink structure includes a first heat sink pattern and a second heat sink pattern on the first heat sink pattern,
    a lower surface of the first heat sink pattern is at a same height level as a lower surface of the first pad,
    the first heat sink pattern includes a same material as the first pad,
    a lower surface of the second heat sink pattern is at a same height level as a lower surface of the second pad, and
    the second heat sink pattern includes a same material as the second pad.

4. The semiconductor device of claim 1, wherein the pad structure includes
    a first pad, and
    a second pad on the first pad, and
    the chip pad, the redistribution line and the first pad are included in a single, continuous instance of material.

5. The semiconductor device of claim 1, wherein the first lower chip further includes
    a silicon substrate,
    a lower layer on the silicon substrate,
    an upper layer on the lower layer, and
    an intermediate layer between the lower layer and the upper layer,
    the chip pad, the pad structure, and the heat sink structure are on the lower layer, and
    the upper layer and the intermediate layer have
        a first opening that extends through both the upper layer and the intermediate layer to expose at least a portion of the chip pad, and
        a second opening that extends through both the upper layer and the intermediate layer to expose at least a portion of a top surface of the pad structure.

6. The semiconductor device of claim 1, wherein the lower base includes a first base pad,
    the lower semiconductor package further includes a wire configured to electrically connect the chip pad and the first base pad to each other, and
    the lower semiconductor package further includes a lower mold layer covering the first lower chip and the wire.

7. The semiconductor device of claim 6, further comprising:
    a second lower chip between the first lower chip and the lower base;

an adhesive layer between the first lower chip and the second lower chip; and a conductive bump between the second lower chip and the lower base, wherein the adhesive layer is in contact with a bottom surface of a silicon substrate of the first lower chip and a top surface of the second lower chip.

8. The semiconductor device of claim 6, wherein the lower mold layer has a first opening extending through at least a portion of the lower mold layer to expose at least a portion of a top surface of the pad structure, and the connection pattern extends away from the upper semiconductor package to be connected to the portion of the pad structure that is exposed by the first opening of the lower mold layer.

9. A semiconductor device, comprising:

a lower semiconductor package;

an upper semiconductor package including at least one chip and on the lower semiconductor package; and a connection pattern between the lower semiconductor package and the upper semiconductor package, and configured to electrically connect the lower semiconductor package and the upper semiconductor package to each other, wherein the lower semiconductor package includes:

a lower base;

a first lower chip on the lower base; and a mold layer on the lower base and contacting a side surface of the first lower chip, wherein the first lower chip includes:

a substrate;

a first insulating layer on the substrate;

a chip pad on the first insulating layer;

a pad structure on the first insulating layer and including a first pad and a second pad on the first pad;

a redistribution line on the first insulating layer and configured to electrically connect the chip pad and the pad structure;

a heat sink structure on the first insulating layer; and a second insulating layer on the first insulating layer, contacting a first portion of the chip pad, a portion of the pad structure and a portion of the redistribution line, and covering at least an upper surface of the redistribution line, and wherein at least a portion of the heat sink structure is at a same height level as at least a second portion of the pad structure.

10. The semiconductor device of claim 9, wherein the lower semiconductor package further includes an upper insulating layer on the second insulating layer, and wherein the second pad penetrates through the upper insulating layer and the second insulating layer and contacts the first pad.

11. The semiconductor device of claim 10, wherein the mold layer further includes a portion on an upper surface of the upper insulating layer, and wherein the connection pattern penetrates through the portion of the mold layer and contacts the second pad.

12. The semiconductor device of claim 9, wherein the redistribution line extends from the first pad and the chip pad, and the second insulating layer contacts a side surface and the upper surface of the redistribution line.

13. The semiconductor device of claim 9, wherein a thickness of the second pad is greater than a thickness of the first pad.

14. The semiconductor device of claim 9, wherein a top surface of the second pad is at a higher level than a top surface of the chip pad.

15. The semiconductor device of claim 9, wherein the lower semiconductor package further includes a second lower chip between the first lower chip and the lower base.

16. A semiconductor device, comprising:

a lower semiconductor package;

an upper semiconductor package including at least one chip and on the lower semiconductor package; and a connection pattern between the lower semiconductor package and the upper semiconductor package, and configured to electrically connect the lower semiconductor package and the upper semiconductor package to each other, wherein the lower semiconductor package includes:

a lower base;

a first lower chip on the lower base; and a mold layer on the lower base and contacting a side surface of the first lower chip, wherein the first lower chip includes:

a chip pad;

a pad structure including a first pad and a second pad on the first pad; and a redistribution line configured to electrically connect the chip pad and the first pad;

a heat sink structure, wherein the chip pad and the first pad are each at a same height level as the redistribution line, wherein at least a portion of the heat sink structure is at a same height level as at least a portion of the pad structure, wherein the mold layer includes a portion overlapping a top surface of the redistribution line, and wherein the connection pattern contacts the second pad.

17. The semiconductor device of claim 16, wherein the first lower chip further includes a silicon substrate and an insulating layer on the silicon substrate, the chip pad, the pad structure, the redistribution line and the heat sink structure are on the insulating layer, and the mold layer contacts a side surface of the silicon substrate.

18. The semiconductor device of claim 16, wherein the lower semiconductor package further includes a second lower chip between the first lower chip and the lower base.

19. The semiconductor device of claim 16, wherein a distance between the chip pad and a center of the first lower chip is greater than a distance between the pad structure and the center of the first lower chip, and the distance between the pad structure and the center of the first lower chip is greater than a distance between the heat sink structure and the center of the first lower chip.

* * * * *